United States Patent [19]
Rathburn

[11] Patent Number: 5,913,687
[45] Date of Patent: Jun. 22, 1999

[54] REPLACEMENT CHIP MODULE

[75] Inventor: James J. Rathburn, Maple Plain, Minn.

[73] Assignee: Gryphics, Inc., Plymouth, Minn.

[21] Appl. No.: 08/955,563

[22] Filed: Oct. 17, 1997

Related U.S. Application Data

[63] Continuation-in-part of application No. 08/852,116, May 6, 1997.

[51] Int. Cl.$^6$ ............................................. H01R 9/09
[52] U.S. Cl. ........................ 439/66; 439/591; 439/71
[58] Field of Search ........................... 439/66, 71, 591, 439/592

[56] References Cited

U.S. PATENT DOCUMENTS

| | | | |
|---|---|---|---|
| 4,445,735 | 5/1984 | Bonnefoy | 439/66 |
| 4,468,074 | 8/1984 | Gordon | 439/296 |
| 4,509,099 | 4/1985 | Takamatsu et al. | 361/413 |
| 4,575,170 | 3/1986 | Gurley | 439/603 |
| 4,593,961 | 6/1986 | Cosmo | 439/66 |
| 4,610,495 | 9/1986 | Landi | 439/728 |
| 4,655,524 | 4/1987 | Etzel | 439/603 |
| 4,691,972 | 9/1987 | Gordon | 439/77 |
| 4,758,176 | 7/1988 | Abe et al. | 439/331 |
| 4,768,971 | 9/1988 | Simpson | 439/329 |
| 4,793,814 | 12/1988 | Zifcak et al. | 439/66 |
| 4,913,656 | 4/1990 | Gordon et al. | 439/67 |
| 5,049,084 | 9/1991 | Bakke | 439/66 |
| 5,061,192 | 10/1991 | Chapin et al. | 439/66 |
| 5,071,359 | 12/1991 | Arnio et al. | 439/91 |
| 5,096,426 | 3/1992 | Simpson et al. | 439/66 |
| 5,163,834 | 11/1992 | Chapin et al. | 439/66 |
| 5,227,959 | 7/1993 | Rubinstein et al. | 361/413 |

FOREIGN PATENT DOCUMENTS

| | | | |
|---|---|---|---|
| 0 431 566 | 6/1991 | European Pat. Off. | H01R 23/72 |
| 0 574 793 | 12/1993 | European Pat. Off. | H01R 13/24 |
| 1 488 328 | 5/1976 | United Kingdom | H01R 13/24 |
| 2 027 560 | 2/1980 | United Kingdom | H01R 9/00 |

*Primary Examiner*—Neil Abrams
*Assistant Examiner*—T C Patel
*Attorney, Agent, or Firm*—Faegre & Benson LLP

[57] ABSTRACT

A replaceable chip module for electrically connecting one or more first circuit members to a second circuit member. The replaceable chip module includes a module housing has a plurality of device sites each capable of receiving at least one first circuit member. A first connector is located in each of the device sites. The first connector includes one or more first contact members having a first compliant member defining a first circuit interface engageable with the first circuit member, a resilient, dielectric encapsulating material defining a second compliant member surrounding a portion of the first contact member, the first and second compliant members providing a first mode of compliance, and at least one end stop positioned to engage with the first contact member in a second mode of compliance. A second connector is positioned to electrically connect the first connector to the second circuit member. A third electrical connector can optionally be provided for electrically connecting the second circuit member to a third circuit member.

30 Claims, 17 Drawing Sheets

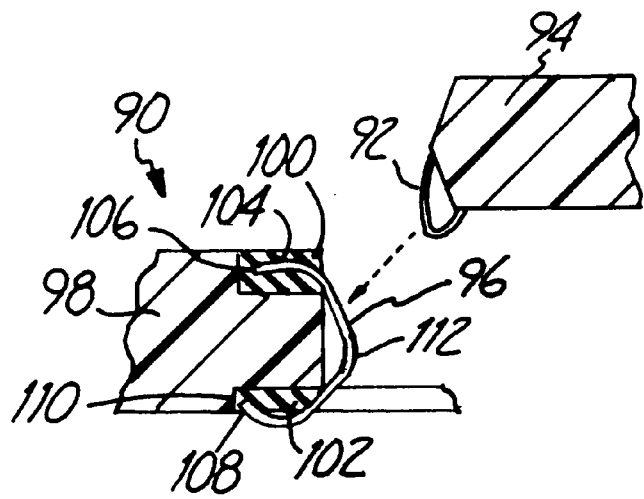
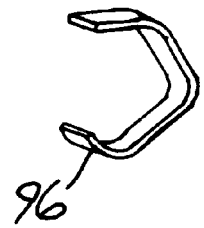
Fig. 6A    Fig. 6B
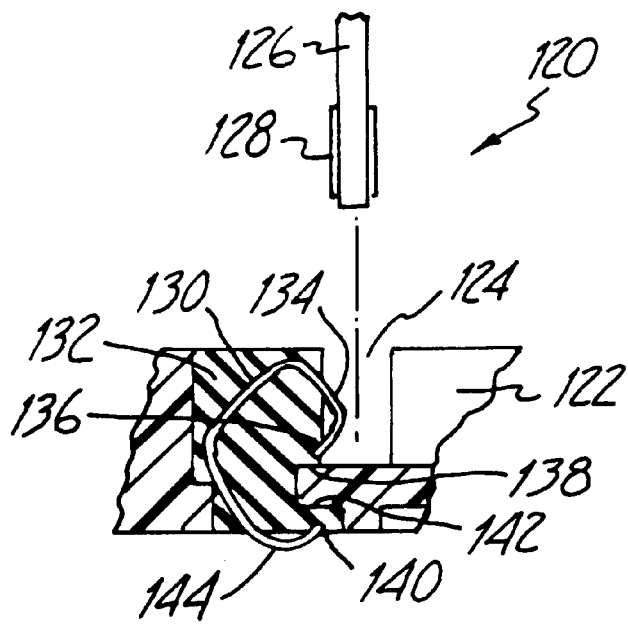
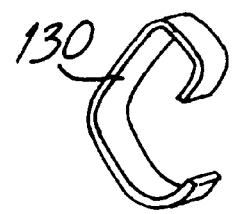
Fig. 7A    Fig. 7B

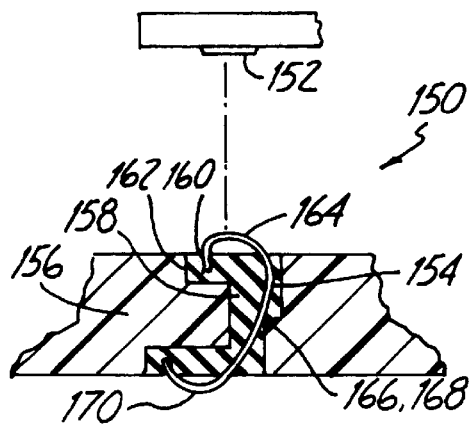
Fig. 8A    Fig. 8B
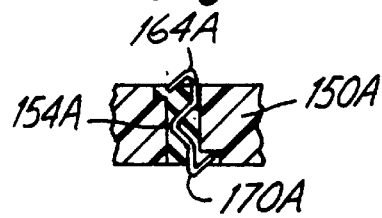
Fig. 9A    Fig. 9B
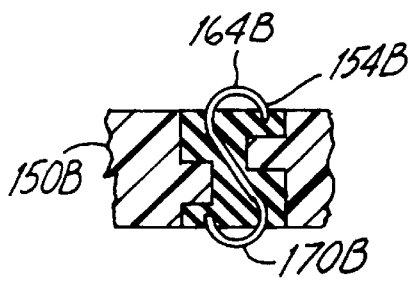
Fig. 10A    Fig. 10B
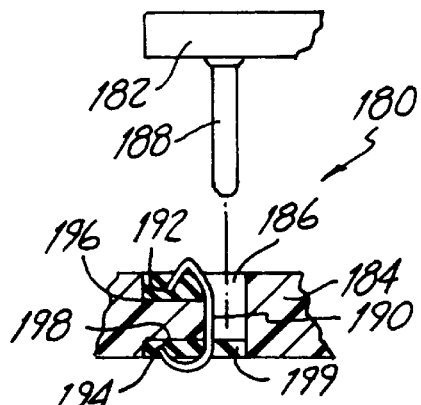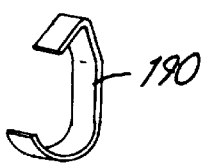
Fig. 11A    Fig. 11B

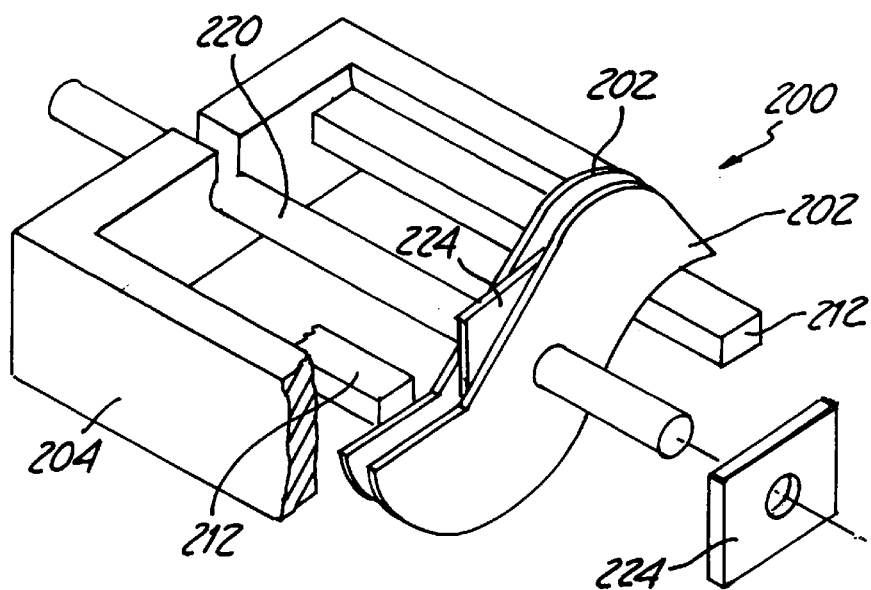
Fig. 13
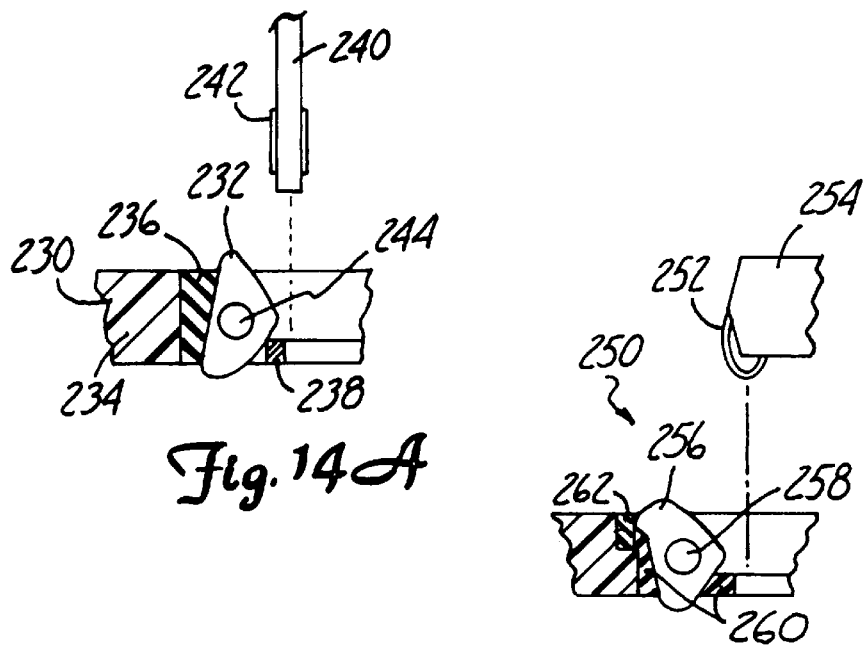
Fig. 14A
Fig. 15
Fig. 14B

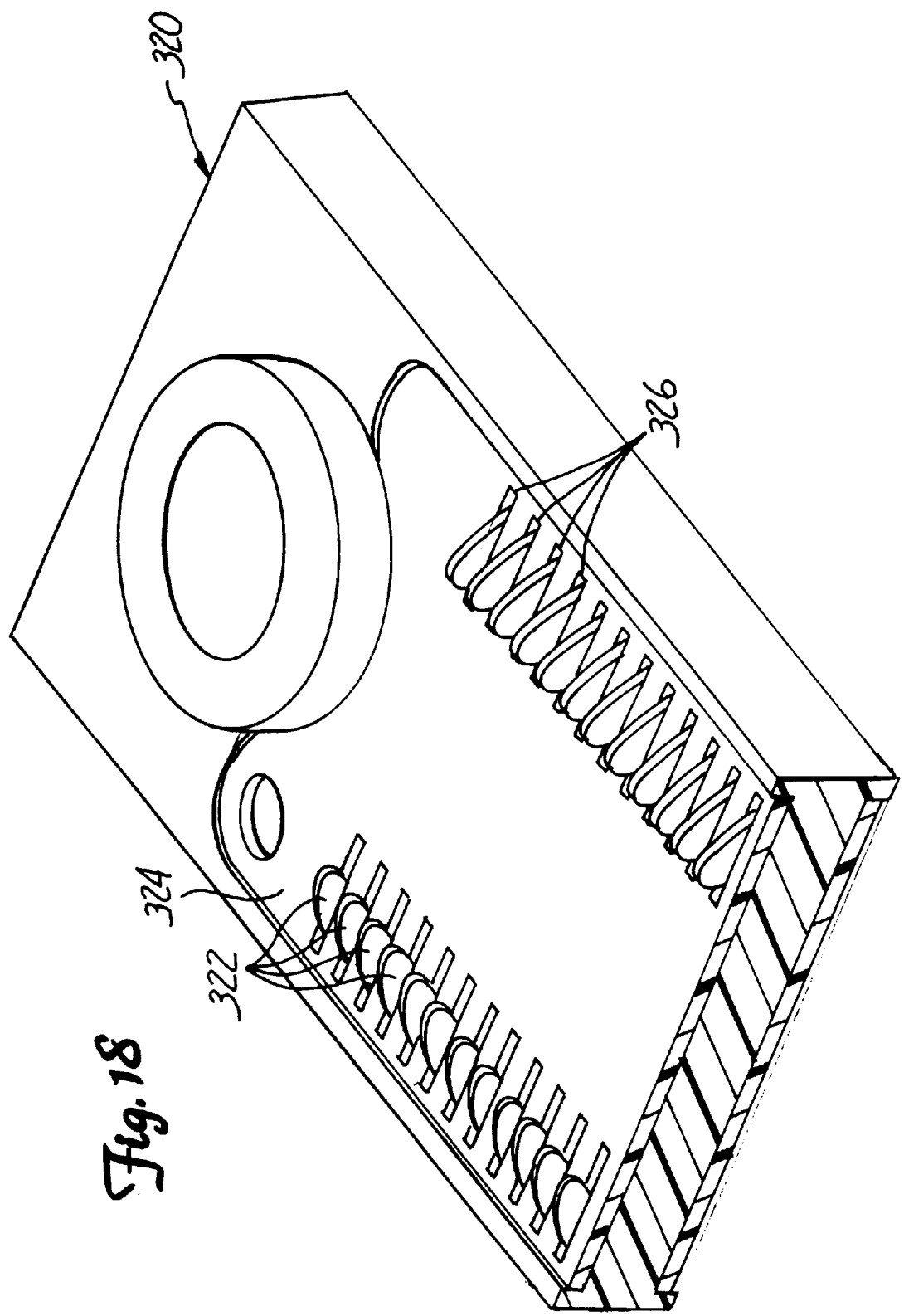

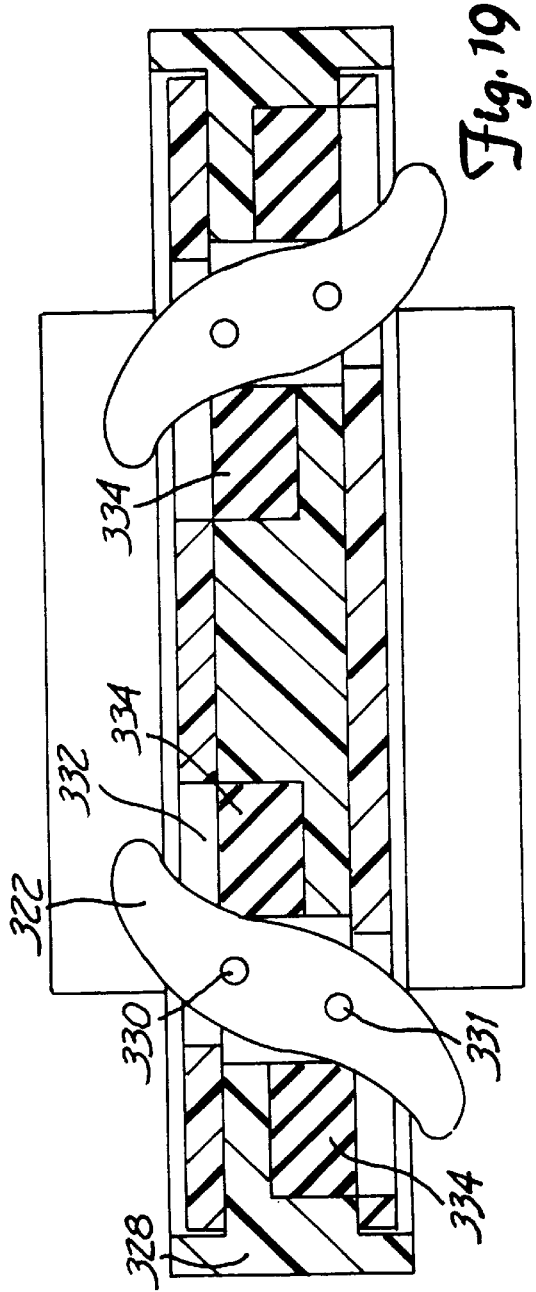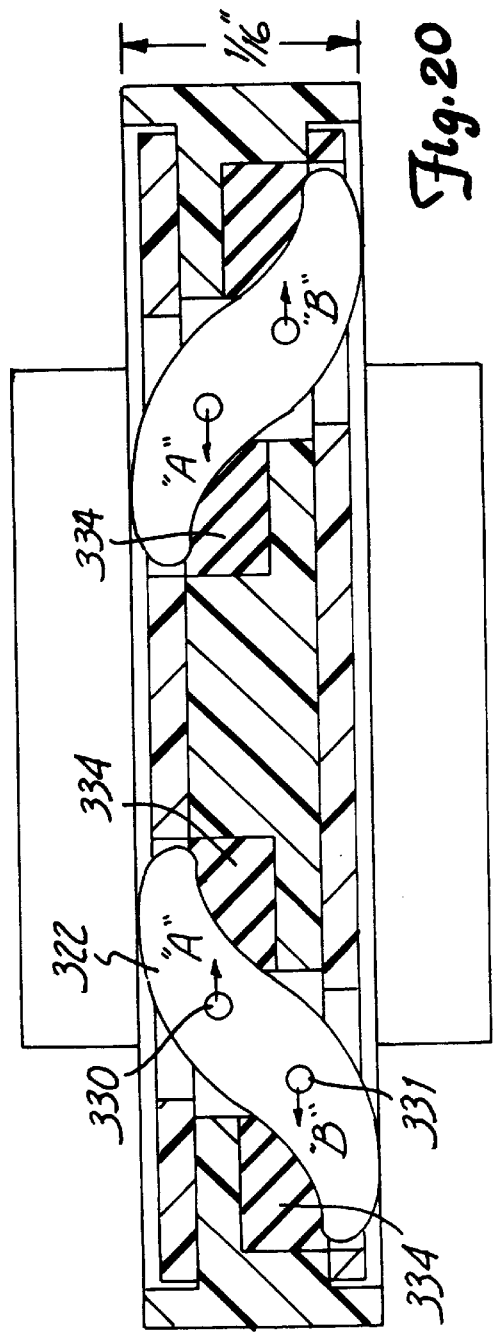

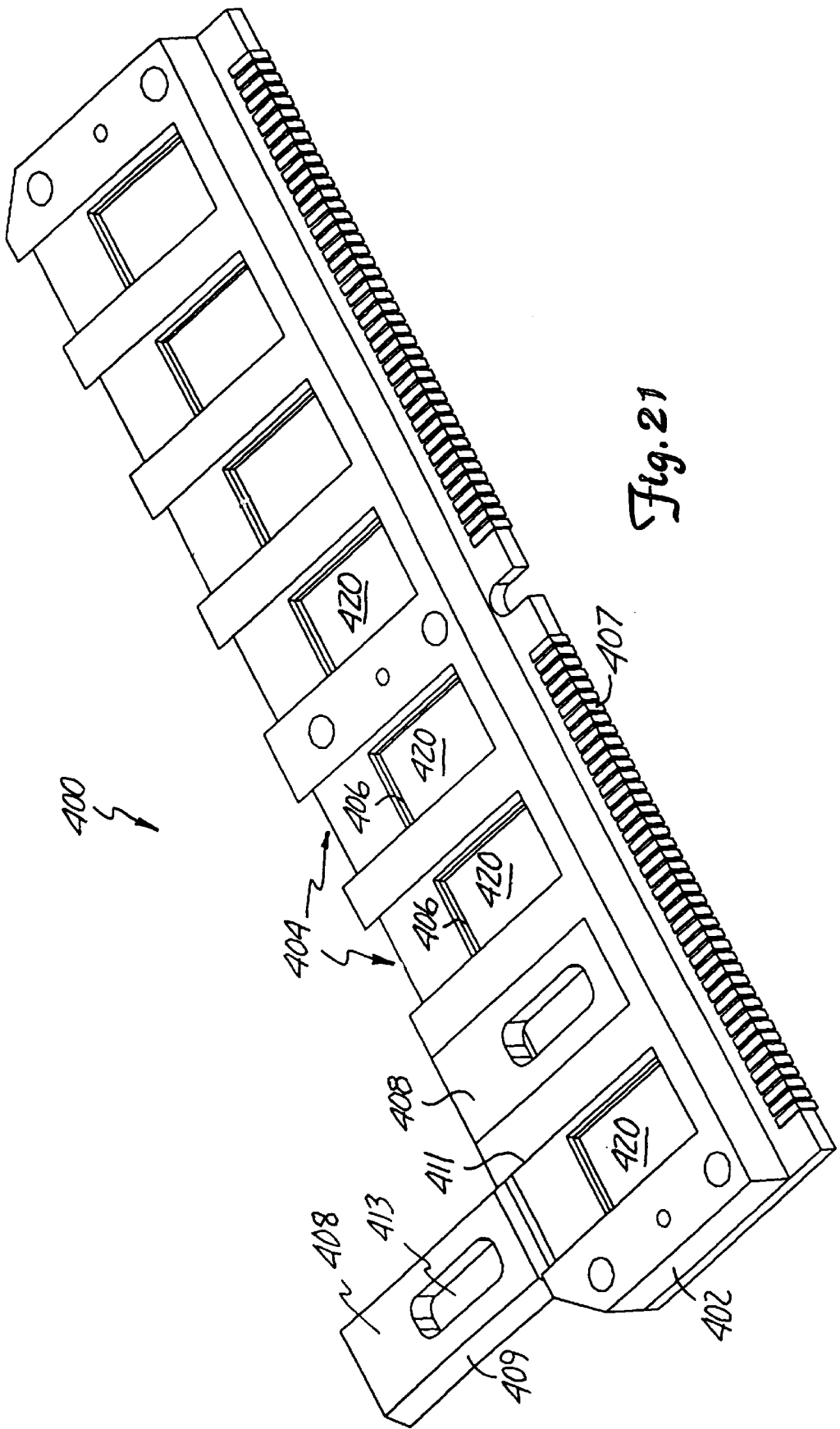

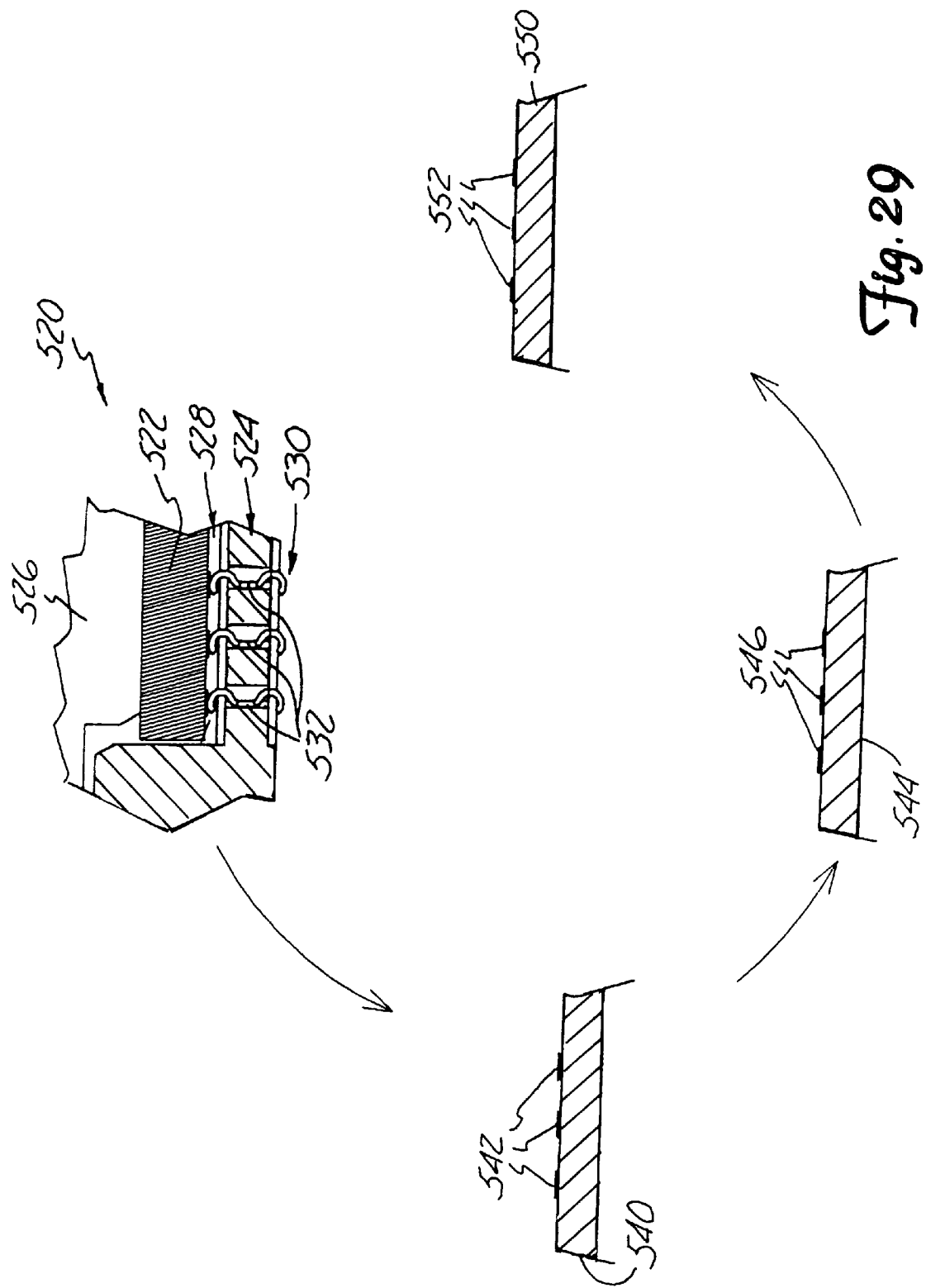

REPLACEMENT CHIP MODULE

The present application is a Continuation-in-Part of U.S. patent application Ser. No. 08/852,116, entitled Electrical Connector with Multiple Modes of Compliance, filed on May 6, 1997.

FIELD OF THE INVENTION

The present invention is directed to a replaceable chip module for electrically connecting one or more first circuit members to a second circuit member.

BACKGROUND OF THE INVENTION

The current trend in connector design for those connectors utilized in the computer field is to provide both high density and high reliability connectors between various circuit devices. High reliability for such connections is essential due to potential system failure caused by misconnections of devices. Further, to assure effective repair, upgrade, testing and/or replacement of various components, such as connectors, cards, chips, boards, and modules, it is highly desirable that such connections be separable and reconnectable in the final product.

Pin-type connectors soldered into plated through holes or vias are among the most commonly used in the industry today. Pins on the connector body are inserted through plated holes or vias on a printed circuit board and soldered in place using conventional means. Another connector or a packaged semiconductor device is then inserted and retained by the connector body by mechanical interference or friction. The tin lead alloy solder and associated chemicals used throughout the process of soldering these connectors to the printed circuit board have come under increased scrutiny due to their environmental impact. The plastic housings of these connectors undergo a significant amount of thermal activity during the soldering process, which stresses the component and threatens reliability.

The soldered contacts on the connector body are typically the means of supporting the device being interfaced by the connector and are subject to fatigue, stress deformation, solder bridging, and co-planarity errors, potentially causing premature failure or loss of continuity. In particular, as the mating connector or semiconductor device is inserted and removed from the present connector, the elastic limit on the contacts soldered to the circuit board may be exceeded causing a loss of continuity. These connectors are typically not reliable for more than a few insertions and removals of devices. These devices also have a relatively long electrical length that can degrade system performance, especially for high frequency or low power components. The pitch or separation between adjacent device leads that can be produced using these connectors is also limited due to the risk of shorting.

Another electrical interconnection method is known as wire bonding, which involves the mechanical or thermal compression of a soft metal wire, such as gold, from one circuit to another. Such bonding, however, does not lend itself readily to high density connections because of possible wire breakage and accompanying mechanical difficulties in wire handling.

An alternate electrical interconnection technique involves placement of solder balls or the like between respective circuit elements. The solder is reflowed to form the electrical interconnection. While this technique has proven successful in providing high density interconnections for various structures, this technique does not allow facile separation and subsequent reconnection of the circuit members.

An elastomer having a plurality of conductive paths has also been used as an interconnection device. The conductive elements embedded in the elastomeric sheet provide an electrical connection between two opposing terminals brought into contact with the elastomeric sheet. The elastomeric material that supports the conductive elements compresses during usage to allow some movement of the conductive elements. Such elastomeric connectors require a relatively high force per contact to achieve adequate electrical connection, exacerbating non-planarity between mating surfaces. Location of the conductive elements is generally not controllable. Elastomeric connectors may also exhibit a relatively high electrical resistance through the interconnection between the associated circuit elements. The interconnection with the circuit elements can be sensitive to dust, debris, oxidation, temperature fluctuations, vibration, and other environmental elements that may adversely affect the connection.

The problems associated with connector design are multiplied when multiple integrated circuit devices are packaged together in functional groups. The traditional way is to solder the components to a printed circuit board, flex circuit, or ceramic substrate in either a bare die silicon integrated circuit form or packaged form. Multi-chip modules, ball grids, array packaging, and chip scale packaging have evolved to allow multiple integrated circuit devices to be interconnected in a group.

One of the major issues regarding these technologies is the difficulty in soldering the components, while ensuring that reject conditions do not exist. Many of these devices rely on balls of solder attached to the underside of the integrated circuit device which is then reflown to connect with surface mount pads of the printed circuit board, flex circuit, or ceramic substrate. As discussed above, these joints have not been proven to be extremely reliable nor easy to inspect for defects. The process to remove and repair a damaged or defective device is costly and many times results in unusable electronic components and damage to other components in the functional group.

Multi-chip modules have had slow acceptance in the industry due to the lack of large scale known good die for integrated circuits that have been tested and burned-in at the silicon level. These dies are then mounted to a substrate which interconnect several components. As the number of devices increases, the probability of failure increases dramatically. With the chance of one device failing in some way and effective means of repairing or replacing currently unavailable, yield rates have been low and the manufacturing costs high.

BRIEF SUMMARY OF THE INVENTION

The present invention is directed to a replaceable chip module for electrically connecting one or more first circuit members to a second circuit member. The replaceable chip module includes a module housing has a plurality of device sites each capable of receiving at least one first circuit member. A first connector is located in each of the device sites. The first connector comprises one or more first contact members comprising a first compliant member defining a first circuit interface engageable with the first circuit member, a resilient, dielectric encapsulating material defining a second compliant member surrounding a portion of the first contact member, the first and second compliant members providing a first mode of compliance, and at least one end stop positioned to engage with the first contact member in a second mode of compliance. A second connector is positioned to electrically connect the first connector to the second circuit member.

In one embodiment, second connector comprises a second contact member having substantially the same structure as the first contact member. In one embodiment, the first contact member and a second contact member comprise a single contact member extending between the first and second circuit members. A third electrical connector can optionally be provided for electrically connecting the second circuit member to a third circuit member. In one embodiment, the third circuit member comprises the present replaceable chip module.

The first connector has multiple modes of compliance and an initial insertion force differing from a secondary insertion force. The first connector has multiple compliant members that can be independently adjusted to accommodate a wide range of first and second circuit members. The first connector allows the contact members to be arranged with a pitch of less than 0.50 millimeters without shorting. The multiple compliant contact members accommodate a wide range of thermal and vibrational effects, and can be configured to accommodate a wide range of compression distances.

The present invention is also directed to a method of utilizing the present replaceable chip module during multiple phases in the life of an integrated circuit device. After placement into the replaceable chip module, the integrated circuit devices can be tested, identified, burned-in, and used in production without ever having to be removed or handled. If one or more of the integrated circuit devices fails during the testing, identification, burn-in, or production phases, the individual circuit device can be removed from the replaceable chip module without damage to the other integrated circuit devices or the replaceable chip module.

Each of the first circuit members can be removed and replaced in the event of failure, upgraded, or changed in configuration. The short electrical length of the multi-mode compliance connector allows for excellent signal integrity and overall size similar to current packaging techniques. By eliminating the need to solder the first circuit members into the module, the present invention greatly reduces the implications of known good die or burn-in packaged integrated circuits.

In theory, any printed circuit board, multi-chip module, or flex circuit that has components soldered in some arrangement can be eliminated by use of the present replaceable chip module. An exemplary list of other applications include dual in-line or single in-line memory modules for use in computers, multi-chip modules for use in a variety of applications, PCMCIA cards for use in notebook computers, embedded computer system cards, and conventional PC board replacement.

The use of electrical connectors with multiple modes of compliance at each device site allows the integrated circuit devices to be placed very close together. Bare die silicon integrated circuits can be located directly in the device site without additional packaging. Additionally, a wide variety of package devices such as a ball grid array (BGA), land grid array (LGA), plastic leaded chip carrier (PLCC), pin grid array (PGA), edge card, small outline integrated circuit (SOIC), dual in-line package (DIP), quad flat package (QFP), leadless chip carrier (LCC), chip scale package (CSP) where the package size is within 20% of the bare die silicon, can be accommodated in a number of configurations with use of the present replaceable chip module. As used herein, integrated circuit refers to packaged or unpackaged bare silicon integrated circuit devices.

The present replaceable chip module can replace a printed circuit board with a group of integrated circuit devices soldered thereto. The present invention allows for economical use of conventional materials that do not need to withstand the temperature effects of repeated soldering and reflow. By including locations for many devices in one module, the space required is much smaller than if multiple device connectors were to be used.

For example, recent studies have shown that modular schemes, such as MCM's, multiple-chip packages, Intel's Pentium 2, memory modules, and PCMCIA cards have demonstrated the benefit of grouping integrated circuit devices together to attain short interconnect lengths. Many expensive integrated circuit devices, such as microprocessors and microcontrollers, are placed into an integrated circuit attach connector so that they can be removed and replaced if needed without the damaging effects of reflow and rework. The present invention allows for the modular concept to be taken to the next step, with a plurality of components retained in a single module where they can be inserted and removed without the need for solder or soldering processes.

BRIEF DESCRIPTION OF THE SEVERAL VIEWS OF THE DRAWINGS

FIG. 6A is a side sectional view of a connector for engagement with a j-lead device.

FIG. 6B is a perspective view of the contact member of FIG. 6A.

FIG. 7A is a side sectional view of a connector for engagement with an edge card connector.

FIG. 7B is a perspective view of the contact member of FIG. 7A.

FIG. 8A is a side sectional view of a connector for engagement with a circuit board.

FIG. 8B is a perspective view of the contact member of FIG. 8A.

FIG. 9A is a side sectional view of an alternate connector for engagement with a circuit board.

FIG. 9B is a perspective view of the contact member of FIG. 9A.

FIG. 10A is a side sectional view of an alternate connector for engagement with a circuit board.

FIG. 10B is a perspective view of the contact member of FIG. 10A.

FIG. 11A is a side sectional view of a connector for engagement with a pin lead device.

FIG. 11B is a perspective view of the contact member of FIG. 11A.

FIG. 13 is a perspective view of the connector of FIG. 12A.

FIG. 14A is a side sectional view of a connector according to the present invention for use with an edge card device.

FIG. 14B is a perspective view of the contact member of FIG. 14A.

FIG. 15 is a side sectional view of a connector according to the present invention for use with a j-lead device.

FIG. 18 is a perspective view of an alternate connector according to the present invention.

FIG. 19 is a sectional view of the connector of FIG. 18 prior to engagement with a circuit member.

FIG. 20 is a sectional view of the connector of FIG. 18 after engagement with a circuit member.

FIG. 21 is a perspective view of an exemplary replaceable chip module according to the present invention.

FIG. 29 is a schematic illustration of use of the present replaceable chip module throughout various portions of the life cycle of a circuit member.

DETAILED DESCRIPTION OF THE INVENTION

Figure 1:
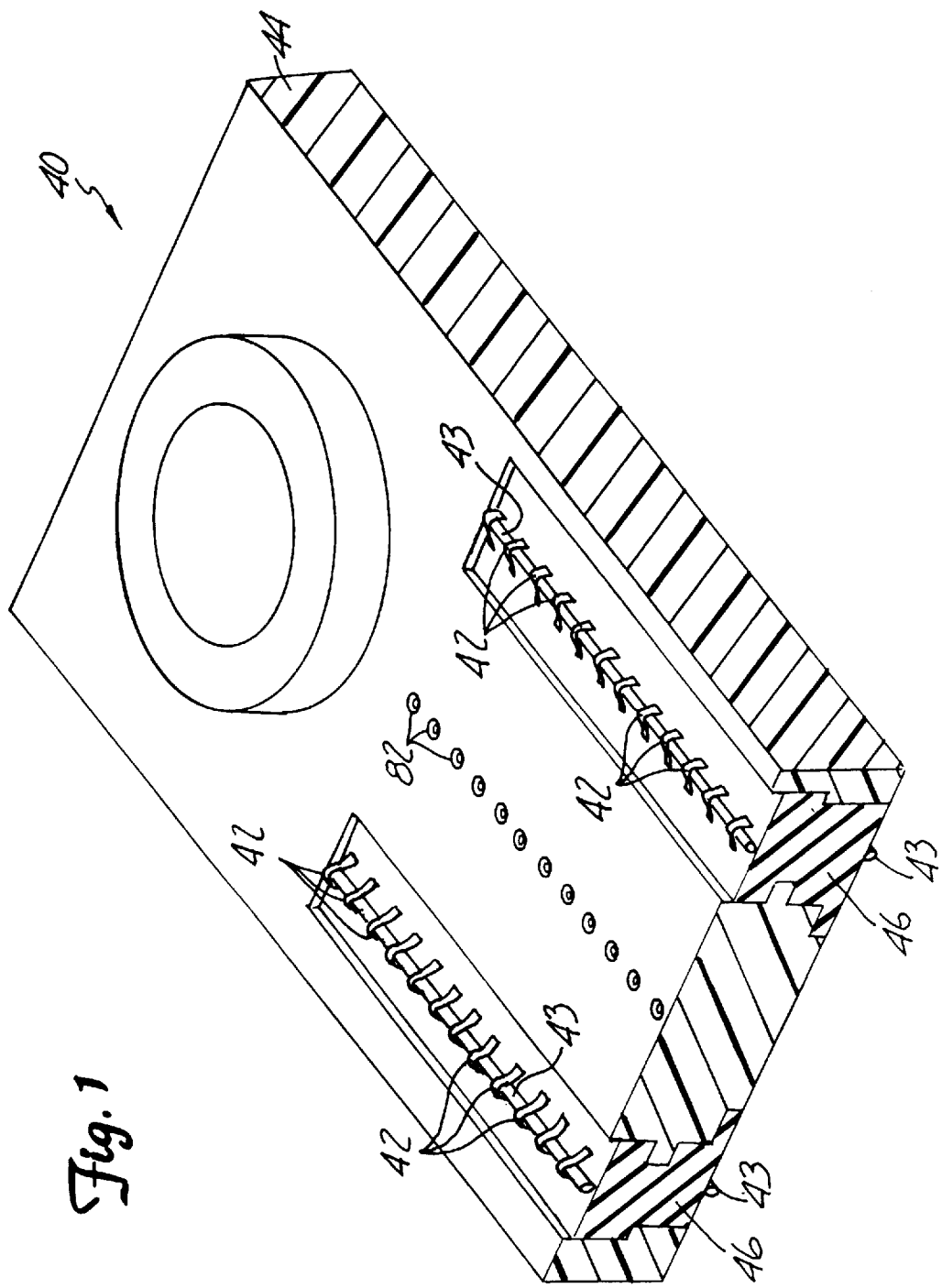
FIG. 1 is a perspective view of an exemplary embodiment of the present connector.

The present invention is directed to a replaceable chip module for electrically connecting one or more first circuit members to a second circuit member. The first circuit members is typically a functional group of packaged or unpackaged integrated circuit devices and the second circuit member is typically a printed circuit board, ceramic substrate, or flex circuit. In one embodiment, the second circuit member is part of the replaceable chip module. The second circuit member typically has a third connector for engaging with a third circuit member.

FIG. 21 is a perspective view of an exemplary replaceable chip module 400 according to the present invention. Housing 402 has a plurality of device sites 404 for receiving one or more first circuit members 414 (see FIG. 22). The first circuit members 414 is illustrated as either a bare die integrated circuit device or a packaged integrated circuit device. In the embodiment of FIG. 21, the device site 404 comprises a recess 406 configured to receive the first circuit members 414.

A cover 408 is provided for the device sites 404 for retaining the first circuit members 414 in the recess 406. In the embodiment of FIG. 21, the covers 408 have a beveled edge 409 for sliding engagement with a corresponding lip 411 on the housing 402. The covers 408 may optionally have an opening 413 for viewing identifying markings on the first circuit members 414. Covers 408 with openings 413 are not preferred for bare die silicon IC devices. A multi-mode solderless connector 420, that will be discussed below, is located at the base of the recess 406. The cover 408 and/or the housing 402 can function as heat sinks.

Figure 22:
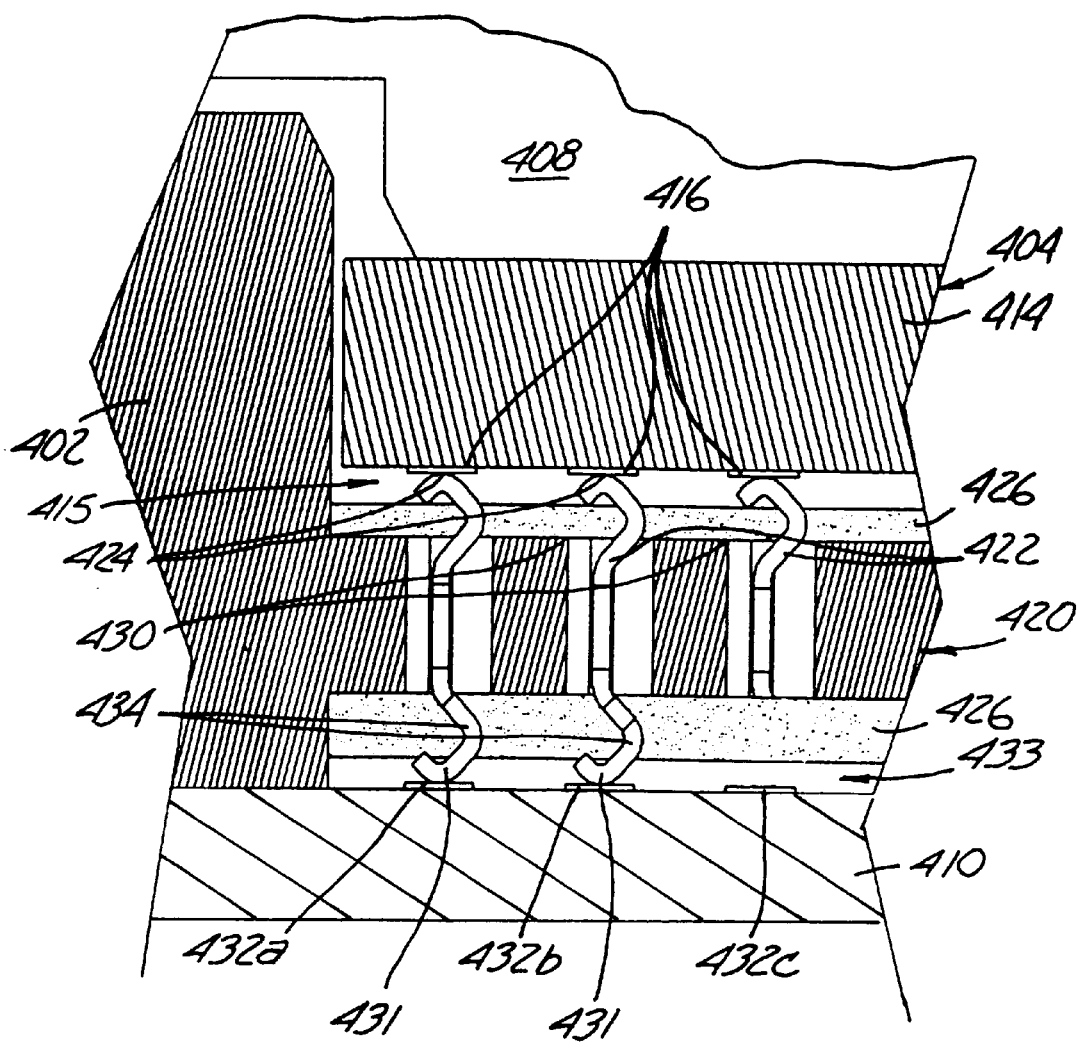
FIG. 22 is a sectional view of solderless connector for use in the replaceable chip module.

As best seen in FIG. 22, the device sites 404 include a multi-mode solderless connector 420 for engaging with the first circuit member 414 and the second circuit member 410. The multi-mode solderless connector 420 includes a plurality of resilient contact members 422 that extend from the first circuit member 414 to the second circuit member 410. In an alternate embodiment, separate sets of resilient contact members 422 could be configured for engaging with the first and second circuit members 410, 414.

The resilient contact members 422 comprise a first compliant member. The contact members 422 includes a first circuit interface portions 424 positioned to engage with contact pads 416 on the first circuit member 414 at a first circuit interface 415. Similarly, some of the contact members 422 include a second circuit interface portions 431 positioned to engage with contact pads 432a, 432b. In the embodiment illustrated in FIG. 22, the contact members 422 do not engage with the contact pad 432c.

A resilient dielectric encapsulating material 426 surrounds a portion of the resilient contact member 422. The encapsulating material 426 comprises a second compliant member. The resilient contact member 422 and dielectric encapsulating material 426 provide a first mode of compliance of the multi-mode solderless connector 420. A series of end stops 430 are located on the housing 402 for engagement with portions of the contact members 422 in a second mode of compliance. The second circuit member 410 includes a third electrical connector 407 electrically connected to the contact pads 432a–c. In the illustrated embodiment, the electrical connector 407 is a 168 DIMM edge card connector. The third electrical connector 407 is for electrically connecting the second circuit member 410 to a third circuit member (see generally FIGS. 26 and 27).

Figure 23:
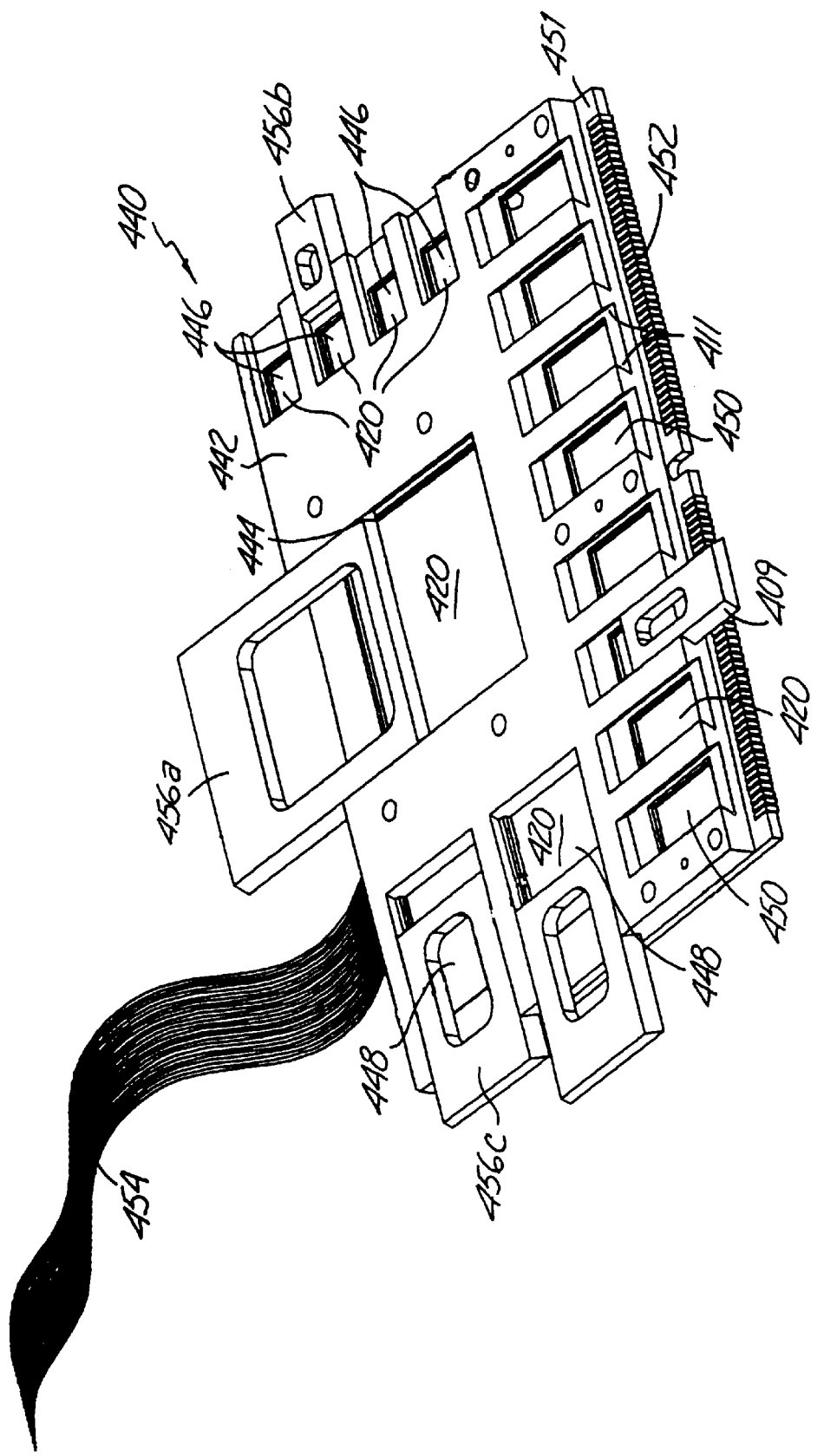
FIG. 23 is a perspective view of an alternate replaceable chip module according to the present invention.

FIG. 23 is a perspective view of an alternate replaceable chip module 440 according to the present invention. The housing 442 includes a device site 444 for receiving a microprocessor device (not shown). Along one edge of the housing 442 are a series of device sites 446 configured to receive flash memory integrated circuit devices (not shown). Device sites 448, 450 are provided along the other edges of the housing 442 for receiving other circuit members supportive of the microprocessor. In the embodiment illustrated in FIG. 23, each of the device sites 444, 446, 448, 450 include an appropriate covers 456a–456c. The covers 456a–456c have a beveled edge 409 for sliding engagement with a corresponding lip 411 on the housing 442.

The replaceable chip module 440 illustrated in FIG. 23 includes a second circuit member 451 having a 168 DIMM edge card connector 452 along one edge and a flex circuit connection 454 along another edge. In the illustrated embodiment, the second circuit member 451 is a printed circuit board. As discussed in connection with FIG. 22, the base of the recesses forming the device sites 444, 446, 448 and 450 include a multi-mode solderless connector 420 for electrically connecting the integrated circuit devices with to the second circuit member 451. Electrical connectors 452 and 454 are provided for electrically connecting the second circuit member 541 to a third circuit member (see generally FIGS. 26 and 27).

Figure 24:
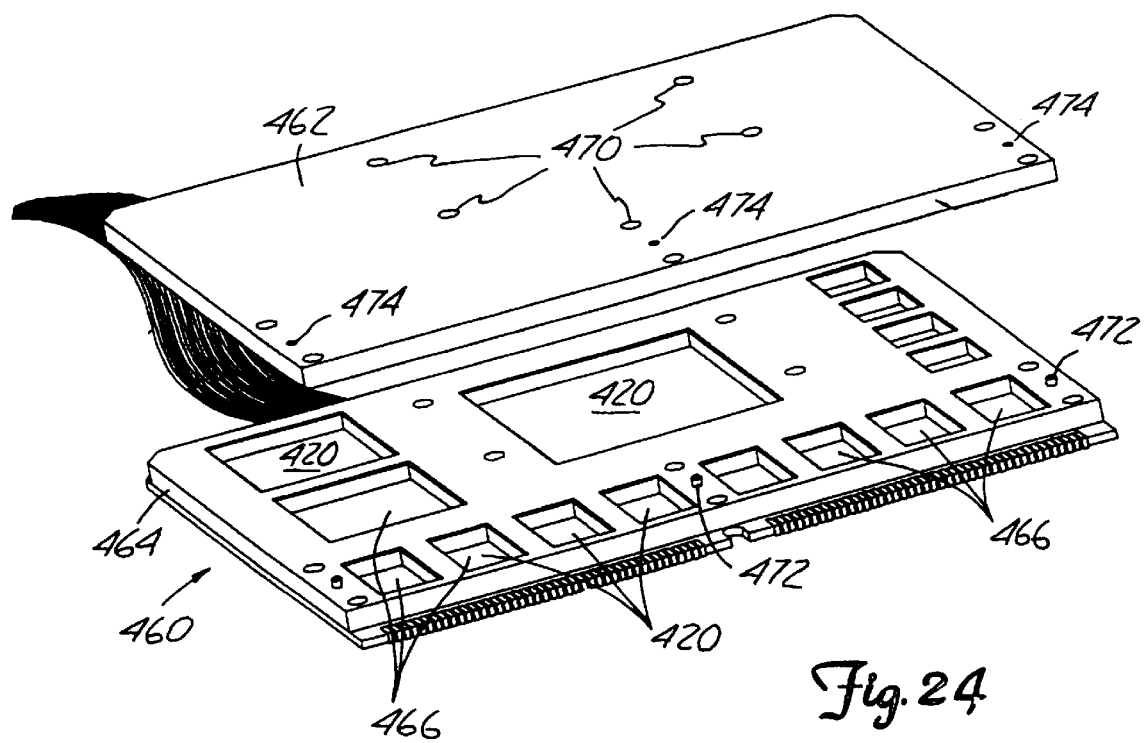
FIG. 24 is a perspective view of an alternate replaceable chip module according to the present invention with a unitary cover.
Figure 25:
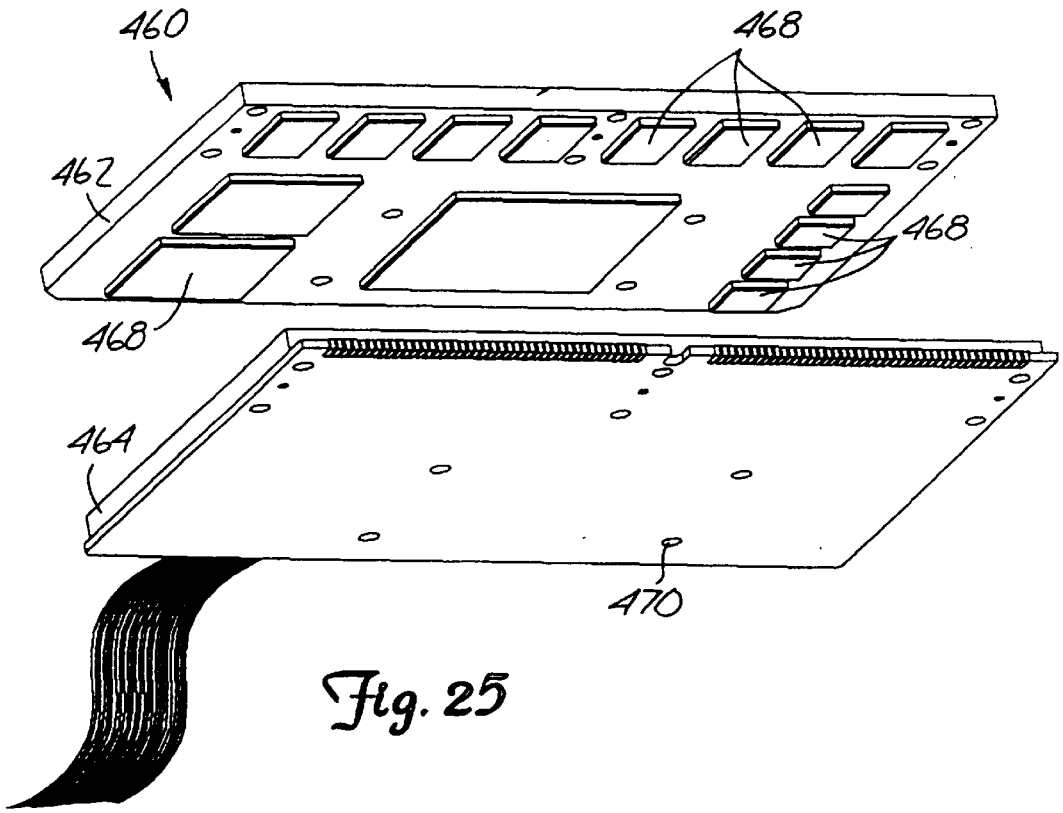
FIG. 25 is a perspective view of an alternate replaceable chip module according to the present invention with a unitary cover.

FIGS. 24 and 25 illustrate an alternate embodiment of the replaceable chip module 460 according to the present invention. A single unitary cover 462 is provided for engagement with a housing 464 containing a plurality of device sites 466. As illustrated best in FIG. 25, the cover 462 includes a series of protrusions 468 which facilitate engagement of the first circuit members with the multi-mode solderless connectors 420. In order to maximize the functionality of the replaceable chip module 460 of FIGS. 24 and 25, the cover 462 is preferably releasably attached to the housing 464 by fasteners, such as screws extending through screw holes 470. Alignment pins 472 and corresponding alignment holes 474 may also be provided for aligning the cover 462 with the housing 464.

Figure 26:
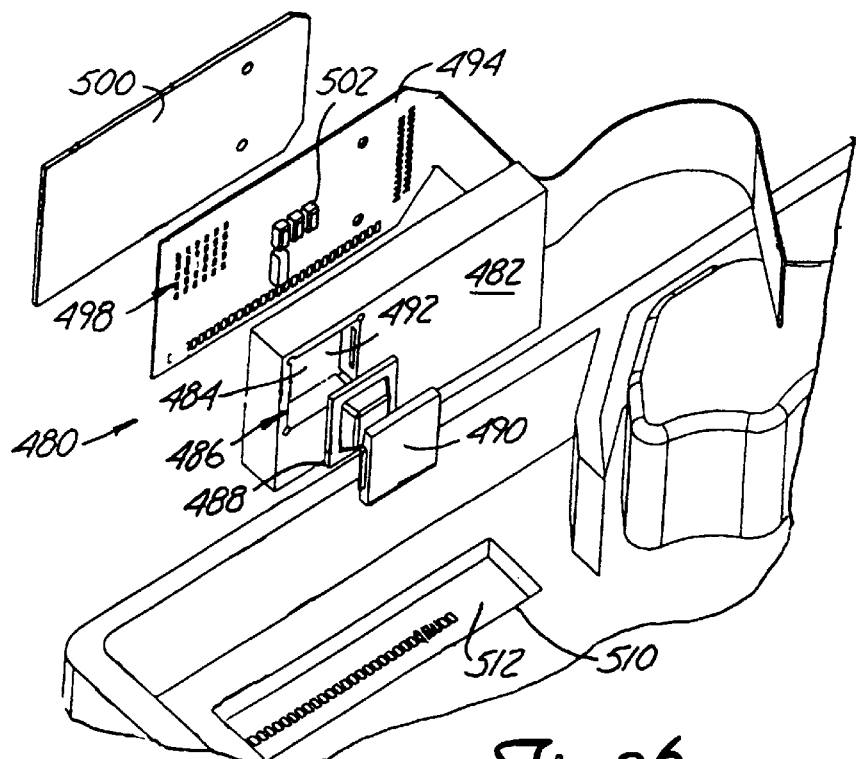
FIG. 26 is a perspective view of a replaceable chip module according to the present invention engaging with an electrical component.
Figure 27:
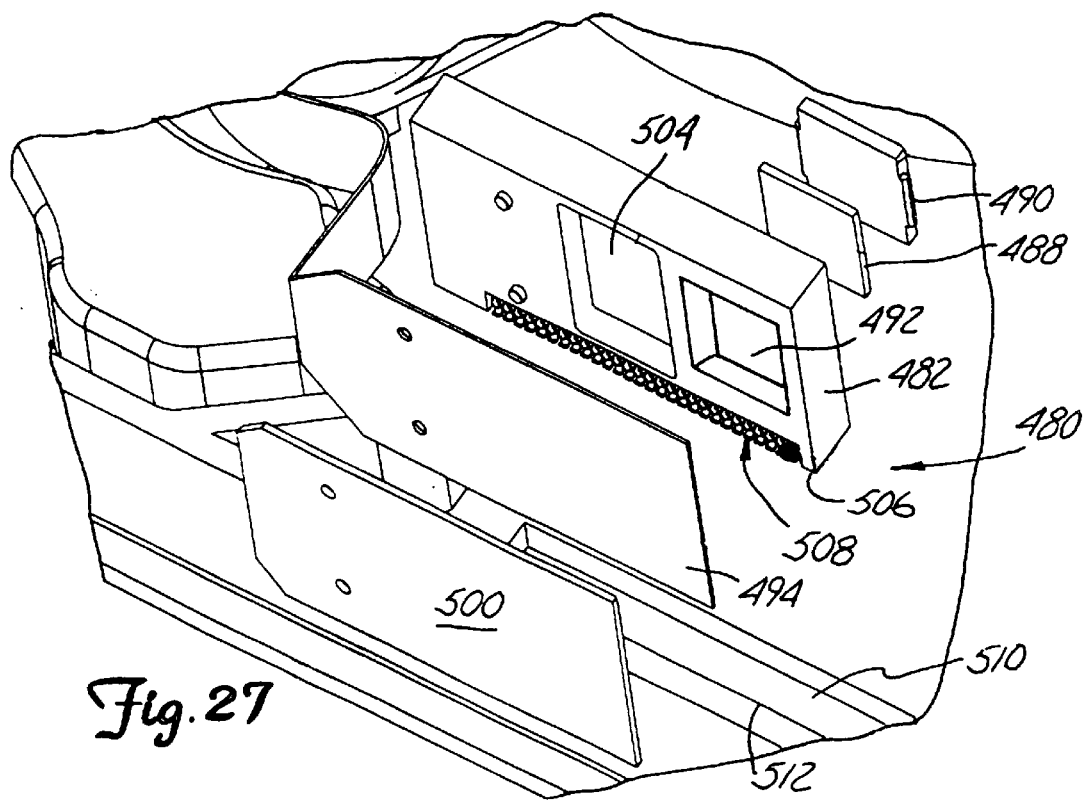
FIG. 27 is a perspective view of a replaceable chip module according to the present invention engaging with an electrical component.

FIGS. 26 and 27 illustrate an alternate embodiment of the present replaceable chip module 480 according to the present invention for use on an electronic device, such as a disk drive. Housing 482 has a recess 484 forming a device site 486 for receiving an integrated circuit device 488. A cover 490 is provided for retaining the integrated circuit device 488 in the device site 486. A multi-mode solderless connector 492 is located in the base of the recess 484.

In the embodiment illustrated in FIGS. 26 and 27, a main circuit board 494 is positioned along the rear surface of the housing 482 for engagement with the multi-mode solderless connector 492. The main circuit board 494 has a plurality of integrated circuit device connection sites 498 for engagement with the multi-mode compliant solderless connector 492 (see FIG. 22). A stiffener 500 may optionally be applied to the rear surface of the main circuit board 494. In the event that the main circuit board 494 includes a series of surface mounted integrated circuit devices 502, the housing 482 includes a recess 504 to permit engagement with the replaceable chip module 480.

As best seen in FIG. 27, bottom edge 506 of the replaceable chip module 480 includes a multi-mode compliant solderless connector 508 for engagement with controller board 512. In the embodiment illustrated in FIG. 26, the controller board 512 has a recess 510 for receiving the replaceable chip module 480.

Figure 28:
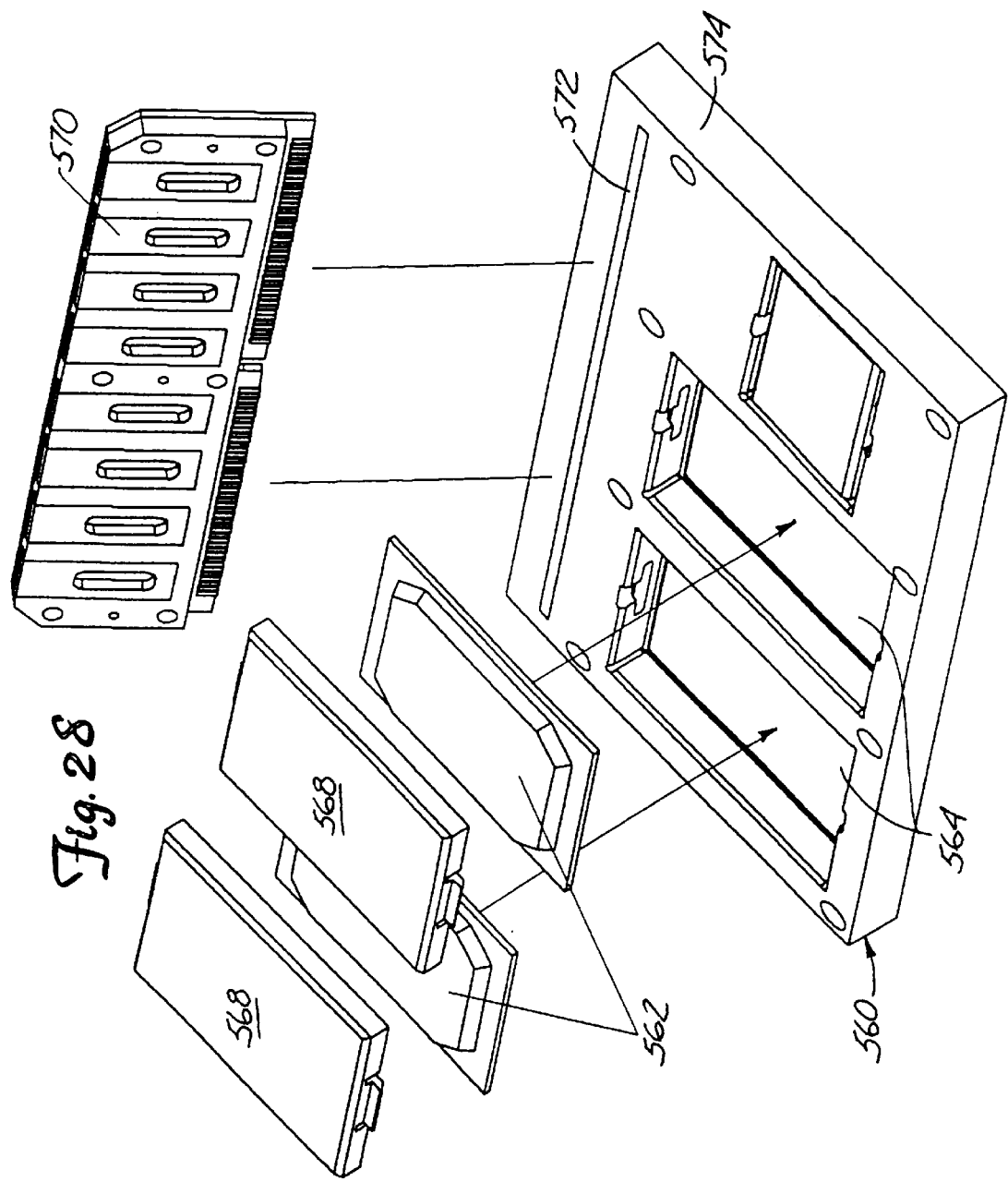
FIG. 28 is a perspective view of an alternate replaceable chip module according to the present invention engaged with a second replaceable chip module.

FIG. 28 illustrates an embodiment with a first replaceable chip module 560 electrically connected with a second replaceable chip module 570. The first replaceable chip module 560 contains one or more first circuit members 562 retained against a multi-mode solderless connector 564 on a second circuit member (not shown) by covers 568. The second replaceable chip module 570 is electrically engaged with a third connector 572 on housing 574 of the first replaceable chip module 560.

FIG. 29 illustrates a method for utilizing a replaceable chip module 520 according to the present invention during multiple phases in the life of a first circuit member 522. One or more first circuit members 522 are retained in the replaceable chip module 520 by a cover 526 and engaged with a multi-mode solderless connector 524 at a first circuit interface 528. In the embodiment illustrated in FIG. 28, the plurality of resilient contact members 532 also forms the second circuit interface 530 for electrically connecting the replaceable chip module 520 (and hence the first circuit member) with a variety of other circuit members 540, 544, 550.

During the initial stages in the life of the first circuit member 522, such as an integrated circuit, the second circuit member 540 is typically a functional test board for performing characterization testing, manual setup testing and/or production testing. The functional test board 540 has a series of contact pads 542 arranged to engage with the resilient contact members 532 at the second circuit interface 530. The resilient contact members 532 permit the first circuit member 522 to be electrically connected temporarily to the second circuit member 540.

During the next stage in the life of the first circuit member 522, the third circuit member 544 is typically a burn-in board for burning-in and temperature cycling the first circuit member 522. Again, the burn-in board 544 has a series of contact pads 546 arranged to engage with the resilient contact members 532 at the second circuit interface 530. The final stage in the life of the circuit member 522, the fourth circuit member 550 is a system level circuit board with appropriately arranged contact pads 552.

The present replaceable chip module 520 allows the first circuit member 522 to be characterized, tested, identified, burned-in, and used in production without ever having to be removed from the module 520. If one or more of the first circuit devices fails during any of these phases, the failed circuit member can be easily removed from the replaceable chip module 520 and replaced, without damage to the other first circuit members or the replaceable chip module.

The solderless connectors with multiple modes of compliance provide an initial insertion force differing from secondary insertion force. The connectors have multiple compliant members that can be independently adjusted to accommodate a wide range of first and second circuit members. The connectors allow the contact members to be arranged with a pitch of 0.50 millimeters or less without shorting. The multiple compliant members accommodate a wide range of thermal and vibrational effects, and can be configured to accommodate a wide range of compression distances. Various embodiments of the multi-mode solderless connector 420 are discussed in detail below.

FIG. 1 is a perspective view of an exemplary embodiment of the present solderless connector 40. A plurality of resilient contact members 42 are retained in a housing 44 by an encapsulating material 46. The housing 44 preferably includes an alignment mechanism, such as openings 82. The density and spacing of the resilient contact members 42 may be altered to accommodate various circuit members.

Figure 2A:
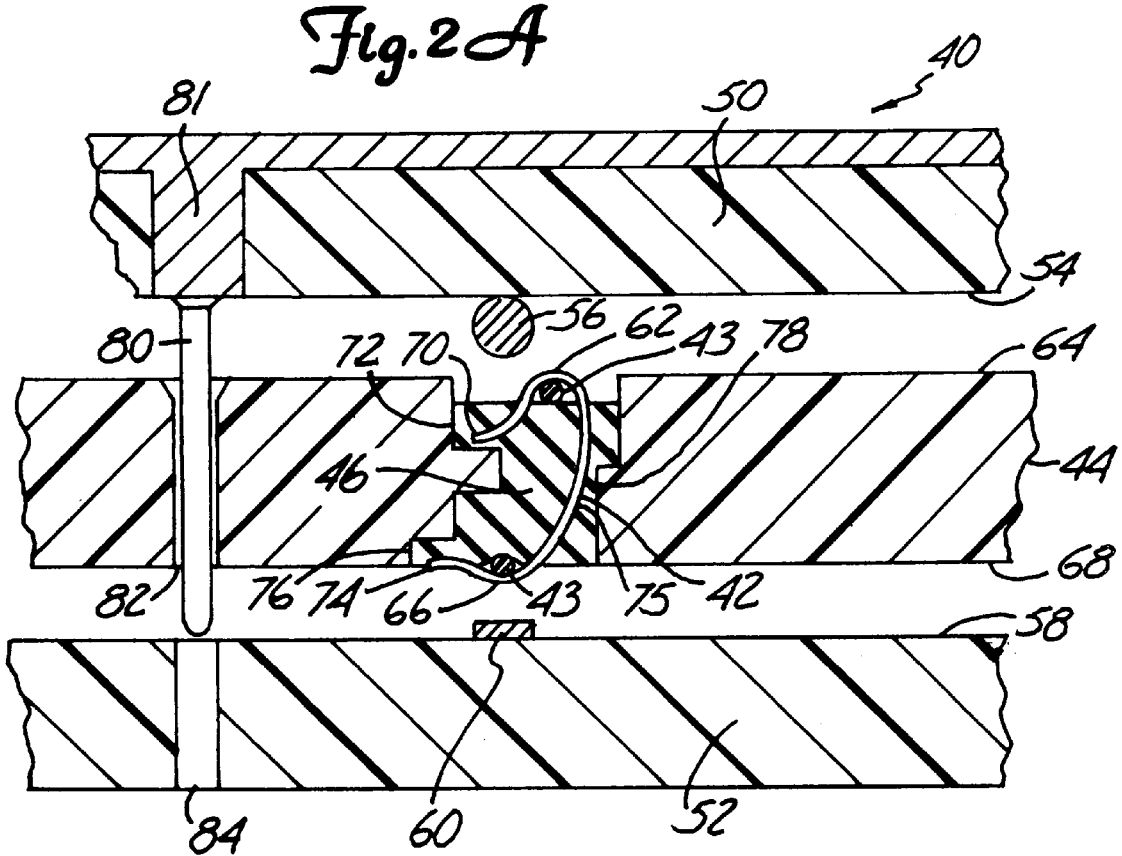
FIG. 2A is a side sectional view of the connector of FIG. 1.

FIG. 2A is a side sectional view of the solderless connector 40 positioned to engage with a first circuit member 50 and a second circuit member 52. The first circuit member 50 has a first operative surface 54 containing a solder ball device 56. The second circuit member 52 has a second operative surface 58 containing a connector pad 60. The circuit members 50, 52 may be printed circuit boards, circuit modules, integrated circuit devices, cable, flex circuit, ribbon connector, semiconductor devices, including surface mounted devices, and a variety of other electrical components.

Figure 2B:
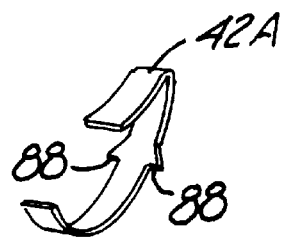
FIGS. 2B and 2C are perspective views of alternate contact members for use in the connector of FIG. 2A.
Figure 2C:
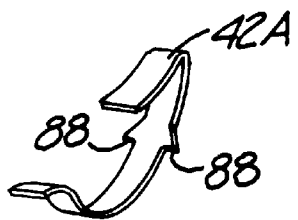

The resilient contact member 42 is retained in the housing 44 by a resilient, dielectric encapsulating material 46. FIGS. 2B and 2C provide a perspective views of contact members 42B, 42C, respectively, having prongs 88 to assist in locating the contact members prior to encapsulation. The contact member 42 may optionally be retained in the housing 44 by mechanical means, such as suspension filaments 43 illustrated in FIG. 2A. The filaments 43 are preferably anchored to the housing 44. The filaments 43 may be permanent or may be removed after application of the encapsulating material 46. The suspension filaments 43 may be a rigid material or a flexible material. They are preferably flexible, but not extendible, so as to permit limited translational and rotational movement of the contact member 42. Translational movement refers to movement having horizontal and/or vertical components.

The contact member 42 has a first circuit interface portion 62 that may extend above a first surface 64 of the housing 44. A second circuit interface portion 66 of the contact member 42 extends above the second surface 68 of the housing 44. Either of the circuit interface portions 62, 66 may be recessed below the surfaces 64, 68 of the housing 44. Distal end 70 of the contact member 42 is positioned opposite end stop 72 on the housing 44. Center portion 75 of contact member 42 is positioned opposite end stop 78 on the housing 44. Distal end 74 of the contact member 42 is located opposite end stop 76 on the housing 44.

Alignment of the two circuit members 50, 52 relative to the connector 40 may be provided by utilizing a protruding pin 80 which extends from a cover 81 extending over the circuit member 50. The pin 80 is aligned and positioned with corresponding opening 82 in the housing 44. A receiving opening 84 is provided in the circuit member 52 for completing the alignment process. It is understood that other means of alignment are readily possible, including the provision of pins extending from opposing surfaces (upper and lower) of the housing 44 for insertion within corresponding openings within the respective circuit members 50, 52. In actual application, two or more alignment mechanisms, such as the protruding pin 80, would typically be provided to achieve proper alignment of the components 50, 52, 40. Other mechanisms for retaining the circuit members 50, 52 in a functional engagement with the connector 40 are disclosed in U.S. Pat. No. 4,445,735 (Bonnefoy); U.S. Pat. No. 4,593,961 (Cosmo); U.S. Pat. No. 4,793,814 (Zifcat et al.); U.S. Pat. No. 5,061,192 (Chapin et al.); and U.S. Pat. No. 5,096,426 (Simpson et al.).

The housing is preferably constructed of a dielectric material, such as plastic. Suitable plastics include phenolics, polyesters, and Ryton® available from Phillips Petroleum Company. The contact member is preferably constructed of copper or similar metallic materials such as phosphor bronze or beryllium-copper. The contact members are preferably plated with a corrosion resistant metallic material such as nickel, gold, silver, or palladium. Examples of suitable encapsulating materials include Sylgard® available from Dow Corning Silicone of Midland, Mich. and Master Sil 713 available from Master Bond Silicone of Hackensack, N.J.

Figure 3:
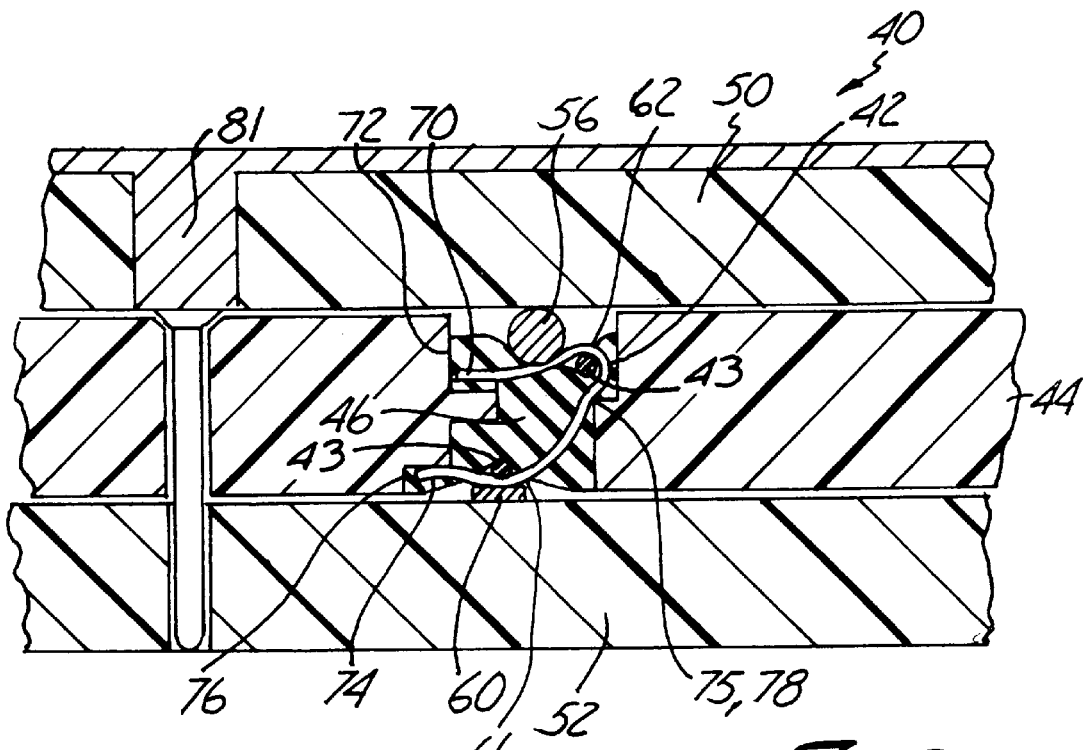
FIG. 3 is a side sectional view of an assembly of circuit members incorporating the connector of FIG. 1.

FIG. 3 is a side sectional view of the connector 40 incorporated into an assembly comprising circuit members 50, 52. As the connector 40 is pressed onto the circuit interface portion 66, it comes in contact with the pad 60. The compliant encapsulant 46 allows for initial movement of the distal end 74 until it contacts end stop 76 on the housing 44. The movement of the distal end 74 preferably includes both vertical and horizontal components so as to cause a wiping action of the circuit interface portion 66 across the surface of the pad 60.

Elastic deformation of the contact member 42 and movement of the contact member 42 within the relatively soft encapsulating material 46 defines a first mode of compliance. The filaments 43 may also contribute to the first mode of compliance where present. The first mode of compliance compensates for non-planarity of the contact members on the circuit member 52. A relatively soft encapsulating material 46 provides a relatively low initial insertion force for the present connector 40. Insertion force refers to engagement of the present connector 40 with one or more circuit members 50, 52.

After the distal end 74 of the contact member 42 is engaged with the end stop 76, the base metal of the contact acts as a load spring, providing the second mode of compliance. The end stop 76 prevents compression beyond the elastic limit of the contact 42 or the encapsulant 46. Similarly, the distal end 70 of the contact 42 then encounters end stop 72 on the housing 44, stopping rotational and translational movement in either the horizontal or vertical directions.

The first mode of compliance is determined primarily by the resilience of the encapsulating material 46, although the elastic deformation of the contact member 42 and the filaments 43 may also be factors. The encapsulant 46 provides a relatively large range of motion at a low force, allowing for the contact 56 to achieve continuity and planarity despite a significant mismatch. The filaments 43 can help define the rotational or translational movement of the contact member 42 during the first mode of compliance.

Once the contact member 42 is compressed against the end stops 72, 78, the base metal substantially defines the second mode of compliance, providing long term connection that resists failure due to fatigue, vibration, temperature fluctuation, and excessive or repeated insertion. The second circuit interface portion 66 operates similarly, although the initial and secondary insertion forces may vary.

The significance of the present connector 40 is that interconnection between the contact member 42 and the device leads 56, 60 is independently acting and independently controlled. For example, the connector 40 is capable of having a different first mode of compliance for the first and second circuit interface portions 62, 66, respectively, by using two or more encapsulating materials. The geometry or thickness of the contact member may also be adjusted to provide a different second modes of compliance at the first and second circuit interface portions 62, 66. For example, the first circuit interface portion 62 provides greater resistance to the contact 56 in the second mode of compliance. The geometry of the second circuit interface portion 66 is such that the resistance provided to the contact 60 in the second mode of compliance is less than the resistance provided by the first circuit interface portion.

The present methodology permits the size, shape, location or material of the contact member and the composition, durometer value and quantity of the encapsulating material, to be varied to accommodate a wide range of connector applications. The present connector 40 may also be configured to provide a relatively short electrical path. The connector 40 is capable of achieving a fine pitch that typically cannot be achieved by pin type connectors. The present connector 40 does not rely on the encapsulant as the sole means of support and does not require the connection members to be deformed in order to gain continuity with the circuit members 50, 52.

For conventional semiconductor device applications, the encapsulating material 46 provides a low initial insertion force in the range of about 10 grams to about 30 grams. The contact member provides a higher secondary insertion force in the range of about 40 grams to about 100 grams. The resulting electrical interconnection provides a higher long term force load toward the end of its engagement motion to ensure long term continuity without failure due to fatigue, compression set, or oxidation.

Figure 4A:
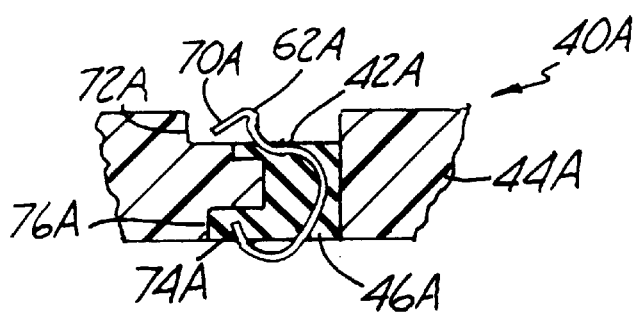
FIG. 4A is a side sectional view of a connector for engagement with a solder ball device.
Figure 4B:
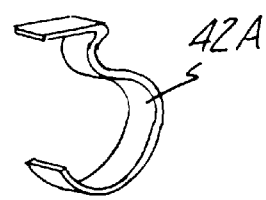
FIG. 4B is a perspective view of the contact member of FIG. 4A.
Figure 5A:
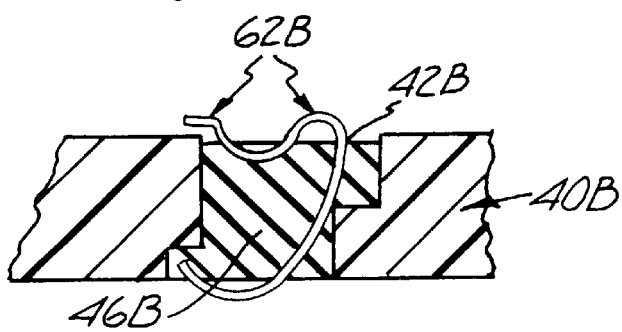
FIG. 5A is a side sectional view of an alternate connector for engagement with a solder ball device.
Figure 5B:
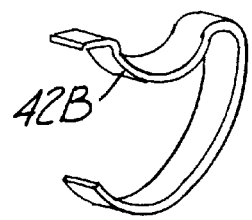
FIG. 5B is a perspective view of the contact member of FIG. 5A.

FIG. 4A illustrates an alternate connector 40A suitable for use with a solder ball device. FIG. 4B is a perspective view of the contact member 42A. The first circuit interface portion 62A is preferably configured for engagement with a ball grid array, such as shown on circuit member 50 of FIG. 2. Connector member 42A is retained in housing 44A by encapsulating material 46A. Distal end 70A is retained opposite end stop 72A and distal end 74A is retained opposite end stop 76A by encapsulating material 46A. FIGS. 5A and 5B illustrate an alternate connector 40B suitable for use with a solder ball device. The first circuit interface portions 62B of the contact member 42B are configured for engagement with a solder ball device at two locations. The two locations of the first circuit interface portions 62B preferably extend above the surface of the encapsulant 46B.

FIG. 6A is a side view of an alternate connector 90 according to the present invention particularly useful with a J-lead device 92 on a circuit member 94. Distal end 104 of contact member 96 is retained in a spaced relationship from end stop 106 on the housing 98 by encapsulating material 100. Similarly, distal end 108 of the contact member 96 is retained in a spaced relationship from the end stop 110 by encapsulating material 102. The contact member 96 is attached to housing 98 by encapsulating materials 100, 102. The encapsulating materials 100, 102 may be the same or different materials. For example, encapsulating material 100 may have a durometer value of about 25, while the material 102 has a durometer value of about 60.

When the J-lead device 92 is brought into engagement with the circuit interface portion 112 on the contact member 96, the distal ends 104, 108 initially move within the encapsulating material 100, 102, respectively, in a first mode of compliance. Again, deformation of the contact member 96 may provide a component of the first mode of compliance. Once the distal ends 104, 108 engage with the end stops 106, 110, respectively, the contact member 96 deforms within its elastic limit in a second mode of compliance. FIG. 6B is a perspective view of the contact member 96 of FIG. 6A.

FIG. 7A is a side sectional view of the present connector 120 for use as an edge card connector. The housing 122 forms a slot 124 for receiving an edge of a card 126 having at least one connector pad 128. A contact member 130 is positioned within an encapsulating material 132 so that a circuit interface portion 134 protrudes into the slot 124. The encapsulating material 132 retains distal end 136 of the contact member 130 in a spaced relationship with end stop 138. Similarly, the encapsulating material retains distal end 140 of the contact member 130 in a spaced relationship from end stop 142. FIG. 7B provides a perspective view of the contact member 130.

As the card 126 is inserted into the slot 124, the circuit interface portion 134 is brought into engagement with the contact 128. Deformation of the encapsulating material 132 and the contact member 130 provide a first mode of compliance whereby the distal end 136 moves toward the end stop 138. Similarly, as the second circuit interface portion 144 is brought into engagement with a connector member (not shown), the distal portion 140 moves in a first mode of compliance toward the end stop 142. Once the distal portions 136, 140 are engaged with the end stops 138, 142, respectively, the contact member 130 operates as a load spring in a second mode of compliance and deforms within its elastic range.

FIG. 8A is a side sectional view of a connector 150 according to the present invention for electrically connecting with a connector pad 152. A contact member 154 is retained within housing 156 by encapsulating material 158. The encapsulating material 158 retains distal end 160 of the contact member 154 in a spaced relationship from end stop 162. As the connector pad 152 is brought into engagement with the circuit interface portion 164 of the contact member 154, the distal end 160 is displaced in a first mode of compliance until it engages with the end stop 162. Deformation of the contact member 154 may provide a component of the first mode of compliance. A center portion 166 of the contact member 154 pivots on a portion 168 of the housing 156 so that engagement with the contact pad 152 causes the contact member 154 to rotate in a counterclockwise direction. Circuit interface portion 170 is similarly displaced when brought into engagement with a connector member (not shown). FIG. 8B is a perspective view of the contact member 154 of FIG. 8A. Once the distal end 160 engages with the end stop 162, the contact member 154 operates as a load spring and deforms within its elastic range.

FIG. 9A is an alternate connector 150A in which the contact member 154A has a shape designed to provide greater resistance in the second mode of compliance. In particular, the sharp point formed in the contact member 154A at the circuit interface portions 164A, 170A provides greater resistance to elastic deformation than the curved circuit interface portions 164, 170 illustrated in FIG. 8A. FIG. 9B is a perspective view of the contact member 154A of FIG. 9A.

FIG. 10A is a side sectional view of an alternate connector 150B according to the present invention. The contact member 154B has a shape intended to provide less resistance in the second mode of compliance than provided by the contact member 154 of FIG. 8A. Although the curvature of the circuit interface portions 164B, 170B corresponds generally to that shown in FIG. 8A, the inverted curvature of the contact member 154B provides for less resistance during the second mode of compliance, and hence a lower secondary insertion force.

FIG. 11A is a side sectional view of a connector 180 according to the present invention for engagement with a pin grid array device 182. Housing 184 has a slot 186 for receiving pin 188. Contact member 190 is positioned adjacent to slot 186. Distal ends 192, 194 of the contact member 190 are retained in a spaced configuration from end stops 196, 198, respectively, of the housing 184. FIG. 11B is a perspective view of the contact member 190.

Figure 12A:
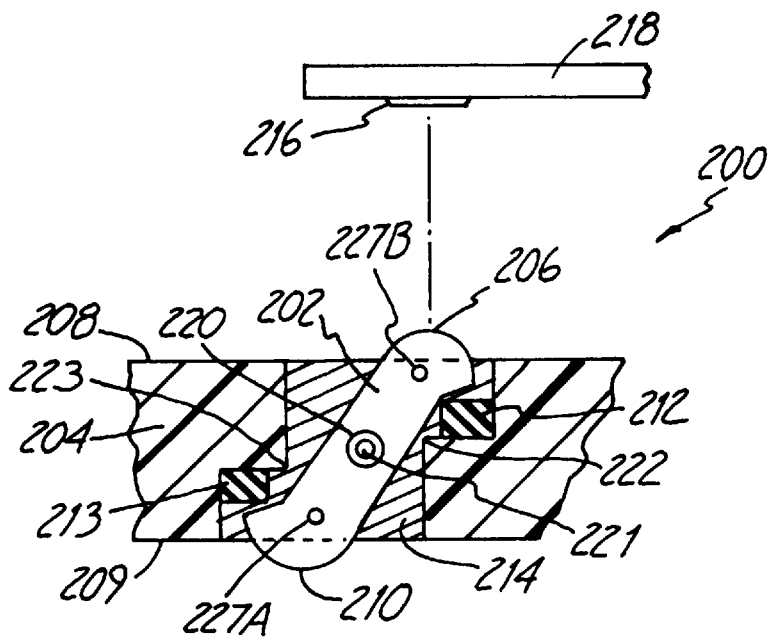
FIG. 12A is a side sectional view of an alternate connector according to the present invention.

FIG. 12A is a side sectional view of an alternate connector 200 according to the present invention. A contact member 202 is located in a housing 204. A first circuit interface portion 206 on the contact member 202 extends above a surface 208 of the housing 204. The second circuit interface portion 210 extends above a surface 209 of the housing 204. Alternately, the first and second interface portions 206, 210 may be recessed below the surfaces 208, 209, respectively. Resilient materials 212, 213 are interposed between the rigid connector member 202 and the housing 204 in two separate locations. The connector member 202 and resilient members 212, 213 are retained within the housing 204 by an encapsulating material 214.

The contact member 202 may be supported by one or more suspension filament 220, 227A, 227B to precisely locate the contact member 202 during encapsulation. The suspension filaments 220, 227A, 227B are preferably anchored to the housing 204 (see FIG. 13). The suspension filaments 220, 227A, 227B may be permanent or may be removed after application of the encapsulating material 214.

The suspension filaments 220, 227A, 227B may be a rigid material or a flexible material. The suspension filaments 220, 227A–227B are preferably flexible, but not extendible so as to permit limited translational and rotational movement of the contact member 202. The conductive elements 202 may be positioned along the filament 220 in such a way that a minimum of two moment arms are created as a result of the location of the interface point along the body of the contact member 202. A single rigid suspension member 220 may be located at a single point 221 near or along the major axis of the contact member 202 such that it provides a pivot point for rotation. Alternatively, second and/or third suspension filaments 227A, 227B may optionally be included (see FIGS. 19 and 20).

The filaments 220, 227A, 227B may be located at any point along the body of the contact member 202 such that it will be positioned in a desired location when the connector 200 is at rest, but will not be restricted from a desired amount of transitional or rotational movement. The suspension filaments 220, 227A, 227B may remain in place after encapsulation, and will result in a reinforced composite that will function in practice in a manner different from that of the encapsulant alone. The filaments 220, 227 will allow the desired motion of the contact member 202 upon incident with the opposing terminals that are to be connected, but will restrict movement in one or more directions as well as limit the total travel of the contact member 202, resulting in an action that will prevent damage to the encapsulant 214, the secondary resilient members 212, 213, the contact member 202, or the opposing terminal 216. The nature of contact member 202 action will allow for each member to move independent of its neighbor through a range sufficient to accommodate coplanarity variances between the conductive elements and any of the opposing terminals to be connected.

The contact member 202 is preferably rigid. As the connector member 216 on the first circuit member 218 is brought in contact with the first circuit interface portion 206, the encapsulating material 214 allows for both translational and rotational movement of the contact member 202 around a filament 220. Movement of the contact member 202 within the encapsulating material 214 comprises a first mode of compliance, resulting in a relatively low initial insertion force with a circuit members, such as 218. The compliant encapsulant 214 allows vertical movement until contact member 202 encounters one or both of the resilient materials 212, 213. The resilient materials 212, 213 in combination with the encapsulant 214 (and optionally the filaments 220, 227A, 227B) provide the second mode of compliance. In the preferred embodiment, the resilient materials 212, 213 are stiffer (higher durometer value) than the encapsulant 214, so that the secondary insertion force is larger than the initial insertion force. The contact member 202 eventually contacts end stops 222, 223 on the housing 204. Alternatively, the resilient materials 212, 213 may be selected so that the secondary insertion force is less than the initial insertion force.

The encapsulant 214 provides a relatively large range of motion at a low force, allowing for the contact 202 to achieve continuity and planarity despite a significant mismatch. In one embodiment, the filament 220 is not a rigid support, allowing for both rotational and translational movement of the contact 202. Once the contact member 202 is compressed against the resilient material 212, 213, the second mode of compliance provides long term connection that resists failure due to fatigue, vibration, temperature fluctuation, and excessive or repeated insertion. In an alternate embodiment in which the contact member 202 is flexible, the connector 200 will operate as a loading spring, as discussed above in connection with FIGS. 1–3.

Figure 12B:
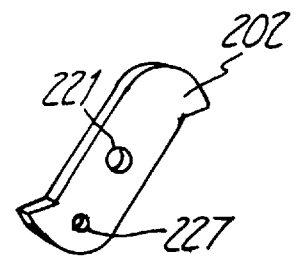
FIG. 12B is a perspective view of the contact member of FIG. 12A.
Figure 12C:
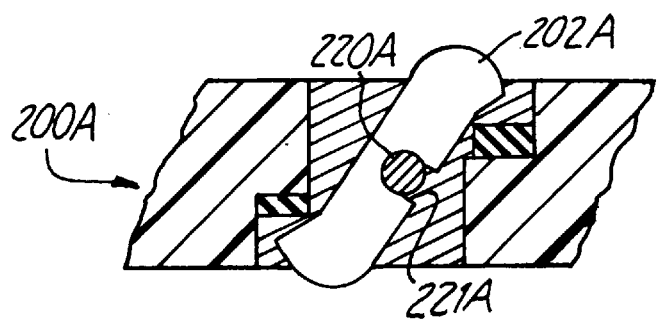
FIG. 12C is a side sectional view of an alternate connector of FIG. 12A.

FIG. 12B is a perspective view of a contact member 202 having an openings 221, 227 for receiving the filament 220. FIG. 12C illustrates an alternate connector 200A in which the opening 221A of the contact member 202A is a slot structure for receiving the filament 220A.

FIG. 13 is a perspective view of the connector 200 having a plurality of contact members 202 separated by spacers 224. The spacers may be incorporated into the filament 220. Alternatively, the contact members 202 may be retained in the desired spaced relationship during application of the encapsulating material 214 (see FIG. 12A). The filament 220 is supported by the housing 204. The spacing between the contact members 202 may be adjusted by altering the thickness of the spacers 224. The present connector is preferably capable of providing contact members having a pitch of less than about 0.4 mm, and more preferably less than about 0.2 mm. The spacers 224 may be constructed from a variety of dielectric materials, such as plastic or ceramics.

FIG. 14A is a side sectional view of an alternate connector 230 in which a cam-shaped contact member 232 is at least partially retained in a housing 234 by a filament 244. FIG. 14B is a perspective view of the contact member 232. A resilient material 238 is located adjacent to the contact member 232 on the side opposite encapsulating material 236. The housing 234 is configured for receiving a card edge device 240 having contact members 242 on at least one surface. As discussed in connection with FIG. 12A, the contact member 232 displaces the encapsulating material 236 in a first mode of compliance. Subsequently, the contact member 232 engages the resilient material 238 to initiate a second mode of compliance. The housing 234 is configured to limit the maximum rotation of the contact member 232 about the filament 244.

FIG. 15 is a side sectional view of an alternate connector 250 configured for engagement with a J-lead device 252 on a circuit member 254. The contact member 256 is positioned on a filament 258 adjacent to encapsulating material 260 and resilient material 262. The resilient material preferably has a higher durometer value than the encapsulating material 260.

Figure 16A:
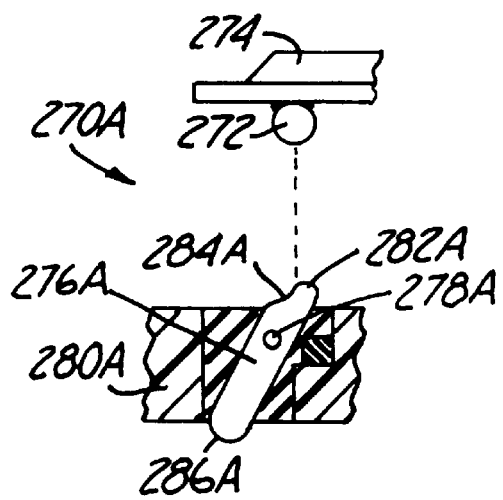
FIG. 16A is a side sectional view of a connector according to the present invention for use with a solder ball device.
Figure 16B:
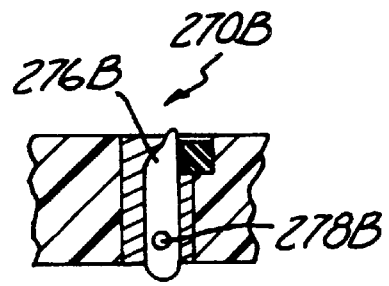
FIG. 16B is a side sectional view of an alternate connector according to the present invention for use with a solder ball device.

FIG. 16A illustrates an alternate connector 270A for engagement with a solder ball device 272 on a circuit member 274. Connector element 276A rotates around pivot point 278A within connector housing 280A. The first circuit interface portion 282A of the contact member 276A includes a depression 284A to facilitate engagement with the ball member 272 of the circuit member 274. A second circuit interface portion 286A protrudes from the bottom of the housing 280A for engagement with a second circuit member (not shown). FIG. 16B is an alternate connector 270B in which the contact member 276B is in a generally vertical configuration for rotation around the pivot point 278B.

Figure 17:
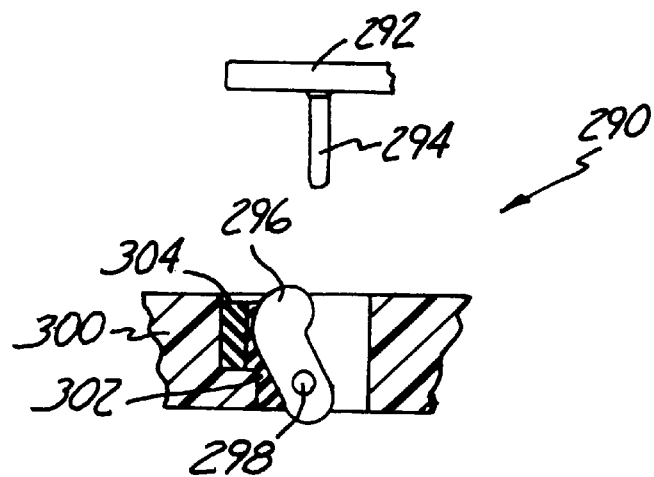
FIG. 17 is a side sectional view of a connector according to the present invention for use with a pin lead device.

FIG. 17 is a side sectional view of an alternate connector 290 according to the present invention configured for engagement with a pin grid array device 292 having a pin 294. The contact member 296 rotates about pivot point 298 within the housing 300. Encapsulating material 302 provides a first mode of compliance and resilient material 304 provides a second mode of compliance.

FIG. 18 is a perspective view of a connector assembly 320 having an array of contact members 322. A template 324 with a plurality of slots 326 maintains the preferred spacing between the contact members 322. The connector assembly may be a wide variety of sizes and shapes.

FIG. 19 is a side sectional view of a pair of contact members 322 of FIG. 18, retained in the connector housing 328 by a pair of flexible filaments 330, 331 and an encapsulating material 332. A resilient material 334 is located adjacent to the contact member 322 in two locations. FIG. 20 illustrates the motion of the contact members 322 and filaments 330, 331 after engagement with a circuit member (not shown). The contact members 322 compress the resilient material 334. In addition to the rotational movement of the contact members 322, the translational movement of the contact members 322 is illustrated by the movement of the filaments 330 generally in a direction "A" toward the center of the connector 330. The filaments 331 move generally in a direction "B" away from the center of the connector 330.

Patents and patent applications disclosed herein, including those cited in the background of the invention, are hereby incorporated by reference. Other embodiments of the invention are possible. It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A replaceable chip module apparatus for electrically connecting one or more first circuit members to a second circuit member, comprising:
    a module housing having a plurality of device sites each capable of receiving at least one first circuit member;
    a first connector located in each of the device sites, the first connector comprising:
        one or more first contact members comprising a first compliant member defining a first circuit interface engageable with the first circuit member;
        a resilient, dielectric encapsulating material defining a second compliant member surrounding at least a portion of the first contact member, the first and second compliant members providing a first mode of compliance when the contact members are displaced by a circuit member;
        at least one end stop against which a portion of the second complaint material is at least partially compressed to provide a flexural point where the first contact member elastically deforms in a second mode of compliance; and
    a second connector for electrically connecting the first connector to the second circuit member.

2. The apparatus of claim 1 wherein elastic deformation of the first contact member and the resilient encapsulating material comprises the first mode of compliance.

3. The apparatus of claim 1 wherein elastic deformation of the first contact member comprises the second mode of compliance.

4. The apparatus of claim 1 wherein engagement of the first contact member at the flexural point initiates the second mode of compliance.

5. The apparatus of claim 1 wherein the second connector comprises:
    one or more second contact members comprising a first compliant member defining a second circuit interface engageable with the second circuit member;
    a resilient, dielectric encapsulating material defining a second compliant member surrounding at least a portion of the second contact member, the first and second compliant members providing a first mode of compliance when the second contact member is displaced by a circuit member; and
    at least one end stop against which a portion of the second complaint material is at least partially compressed to provide a flexural point where the second contact member elastically deforms in a second mode of compliance.

6. The apparatus of claim 5 wherein a first contact member and a second contact member comprise a single contact member extending between the first and second circuit members.

7. The apparatus of claim 1 further comprising a third connector for electrically connecting the second circuit member to a third circuit member.

8. The apparatus of claim 7 wherein the third circuit member comprises a replaceable chip module in accordance with claim 1.

9. The apparatus of claim 1 comprising a plurality of resilient contact members at each of the plurality of device sites.

10. The apparatus of claim 1 wherein the module housing comprises a heat sink.

11. The apparatus of claim 1 further comprising at least one cover for the device sites, the cover comprising a heat sink.

12. The apparatus of claim 1 wherein the first circuit members comprise packaged or unpackaged integrated circuit devices.

13. The apparatus of claim 1 wherein the first circuit members comprise a functional group of integrated circuit devices.

14. The apparatus of claim 1 wherein the second circuit interface is selected from a group consisting of edge connectors, ribbon cables, printed circuit boards, integrated circuit devices, organic or inorganic substrates, flex circuits, and rigid circuits.

15. The apparatus of claim 1 wherein the first circuit interface portion is capable of engaging with a connector member selected from the group consisting of an edge card, a j-lead device, a flex circuit, a ribbon connector, a cable, a ball grid array (BGA), a land grid array (LGA), a plastic leaded chip carrier (PLCC), a pin grid array (PGA), a small outline integrated circuit (SOIC), a dual in-line package (DIP), a quad flat package (QFP), a leadless chip carrier (LCC), and a chip scale package (CSP).

16. A replaceable chip module for electrically connecting one or more first circuit members to a second circuit member, comprising:
    a module housing having a plurality of device sites each capable of receiving at least one first circuit member;
    a first connector located in each of the device sites, the first connector comprising:
        one or more rigid contact members positioned in each of the device sites;
        a first resilient, dielectric encapsulating material comprising a first compliant member surrounding at least a portion of the contact member, the encapsulating material capable of providing a first mode of compliance when the contact members are displaced by a circuit member; and a second resilient material comprising a second compliant member interposed between the rigid contact member and an end stop on the first connector, whereby the first and second compliant members are capable of providing a second mode of compliance when the contact members are further displaced by the circuit member; and a second connector for electrically connecting the first connector to the second circuit member.

17. The apparatus of claim 16 further comprising a third connector for electrically connecting the second circuit member to a third circuit member.

18. The apparatus of claim 16 wherein the third circuit member comprises a replaceable chip module in accordance with claim 16.

19. An assembly incorporating a connector comprising:

a module housing having a plurality of device sites each containing at least one first circuit member;

a first connector located in each of the device sites, the first connector comprising:

one or more first contact members comprising a first compliant member defining a first circuit interface engageable with the first circuit member;

a resilient, dielectric encapsulating material defining a second compliant member surrounding at least a portion of the first contact member, the first and second compliant members providing a first mode of compliance when the contact member is displaced by a circuit member;

at least one end stop against which a portion of the second complaint material is at least partially compressed to provide a flexural point where the contact member elastically deforms in a second mode of compliance; and and a second connector for electrically connecting the first connector to a second circuit member.

20. The apparatus of claim 19 further comprising a third connector for electrically connecting the second circuit member to a third circuit member.

21. The apparatus of claim 19 wherein the third circuit member comprises a replaceable chip module in accordance with claim 19.

22. An assembly incorporating a connector comprising:

a module housing having a plurality of device sites each containing at least one first circuit member;

a first connector located in each of the device sites, the first connector comprising:

one or more rigid contact members positioned in each of the device sites;

a first resilient, dielectric encapsulating material comprising a first compliant member surrounding at least a portion of the contact member, the encapsulating material capable of providing a first mode of compliance when the contact members are displaced by a circuit member; and a second resilient material comprising a second compliant member interposed between the rigid contact member and an end stop on the first connector, whereby the first and second compliant members are capable of providing a second mode of compliance when the contact members are further displaced by a circuit member; and a second connector for electrically connecting the first connector to a second circuit member.

23. The apparatus of claim 22 further comprising a third connector for electrically connecting the second circuit member to a third circuit member.

24. The apparatus of claim 22 wherein the third circuit member comprises a replaceable chip module in accordance with claim 22.

25. The apparatus of claim 1 wherein the first circuit interface portion comprises a cup-shaped configuration that wraps around a portion of the connector member of a circuit member.

26. The apparatus of claim 1 wherein the first circuit interface portion comprises a shape complementary to a shape of a connector member on one or more of the circuit members.

27. The apparatus of claim 1 wherein at least a portion of the second mode of compliance is determined by a geometry of the first contact member.

28. The apparatus of claim 1 wherein at least a portion of the second mode of compliance is determined by a thickness of the first contact member.

29. The apparatus of claim 1 wherein the first contact members comprise at least one bend so that the first circuit interface portion is off-set from a distal end thereof.

30. The apparatus of claim 1 wherein the end stop comprises a flat surface on the housing.

* * * * *

UNITED STATES PATENT AND TRADEMARK OFFICE
CERTIFICATE OF CORRECTION

PATENT NO. : 5,913,687
DATED : June 22, 1999
INVENTOR(S) : Rathburn

It is certified that error appears in the above-identified patent and that said Letters Patent is hereby corrected as shown below:

On title page, item [54] and col. 1, line 1,
    delete "REPLACEMENT" and insert --REPLACEABLE--.

Signed and Sealed this

Second Day of November, 1999

Attest:

Attesting Officer

Q. TODD DICKINSON

Acting Commissioner of Patents and Trademarks